(12) United States Patent
Lin et al.

(10) Patent No.: US 10,534,665 B2
(45) Date of Patent: Jan. 14, 2020

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventors: Yu-Hsiang Lin, Yunlin (TW); Shao-Wei Yen, Kaohsiung (TW); Cheng-Che Yang, New Taipei (TW); Kuo-Hsin Lai, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 74 days.

(21) Appl. No.: 15/884,407

(22) Filed: Jan. 31, 2018

(65) Prior Publication Data

US 2019/0163567 A1    May 30, 2019

(30) Foreign Application Priority Data

Nov. 29, 2017   (TW) .............................. 106141699 A

(51) Int. Cl.
| | | |
|---|---|---|
| G06F 11/10 | (2006.01) | |
| H03M 13/37 | (2006.01) | |
| H03M 13/45 | (2006.01) | |
| G11C 29/52 | (2006.01) | |

(52) U.S. Cl.
CPC .......... *G06F 11/1068* (2013.01); *G11C 29/52* (2013.01); *H03M 13/3746* (2013.01); *H03M 13/458* (2013.01)

(58) Field of Classification Search
CPC .................................................... G06F 11/1076
USPC ........................................................... 714/764
See application file for complete search history.

(56) References Cited

U.S. PATENT DOCUMENTS

| | | | | |
|---|---|---|---|---|
| 7,184,486 | B1 * | 2/2007 | Wu | H03M 13/1105 375/262 |
| 2010/0241934 | A1 * | 9/2010 | Kuri | H03M 13/1102 714/785 |
| 2011/0055668 | A1 * | 3/2011 | Kim | H03M 13/152 714/782 |
| 2015/0381206 | A1 * | 12/2015 | Fainzilber | H03M 13/1108 714/758 |

* cited by examiner

*Primary Examiner* — Fritz Alphonse
(74) *Attorney, Agent, or Firm* — JCIPRNET

(57) ABSTRACT

A decoding method for a memory storage device including a rewritable non-volatile memory module is provided according to an exemplary embodiment of the invention. The method includes: reading at least one memory cells by using at least one read voltage level to obtain a codeword; performing a parity check operation on the codeword by an error checking and correcting circuit to generate a syndrome sum corresponding to the codeword; and dynamically adjusting a first parameter used by the error checking and correcting circuit in a first decoding operation based on whether the syndrome sum is less than a first threshold value and performing the first decoding operation on the codeword by the error checking and correcting circuit by using the first parameter.

24 Claims, 12 Drawing Sheets

$$900 \quad 901 \quad 902$$

$$\begin{Bmatrix} 0 & 0 & 1 & 0 & 1 & 0 & 0 & 1 & 1 \\ 1 & 0 & 0 & 0 & 1 & 0 & 1 & 0 & 0 \\ 0 & 1 & 0 & 1 & 0 & 0 & 0 & 1 & 0 \\ 0 & 1 & 0 & 0 & 1 & 0 & 0 & 1 & 0 \\ 1 & 0 & 0 & 1 & 0 & 0 & 1 & 0 & 1 \\ 0 & 0 & 1 & 1 & 0 & 1 & 0 & 0 & 1 \\ 0 & 1 & 0 & 0 & 0 & 1 & 1 & 0 & 0 \\ 1 & 0 & 1 & 0 & 0 & 1 & 0 & 0 & 0 \end{Bmatrix} \begin{Bmatrix} V_0 \\ V_1 \\ V_2 \\ V_3 \\ V_4 \\ V_5 \\ V_6 \\ V_7 \\ V_8 \end{Bmatrix} = \begin{Bmatrix} S_0 \\ S_1 \\ S_2 \\ S_3 \\ S_4 \\ S_5 \\ S_6 \\ S_7 \end{Bmatrix}$$

$$\underbrace{\begin{matrix} S_1 & S_2 & S_0 & S_2 & S_0 & S_5 & S_1 & S_0 & S_0 \\ + & + & + & + & + & + & + & + & + \\ S_4 & S_3 & S_5 & S_4 & S_1 & S_6 & S_4 & S_2 & S_4 \\ + & + & + & + & + & + & + & + & + \\ S_7 & S_6 & S_7 & S_5 & S_3 & S_7 & S_6 & S_3 & S_5 \end{matrix}}_{\text{syndrome weights}}$$

FIG. 9

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 106141699, filed on Nov. 29, 2017. The entirety of the above-mentioned patent application is hereby incorporated by reference herein and made a part of this specification.

BACKGROUND

Technical Field

The invention relates to a decoding method, a memory storage device, and a memory control circuit unit.

Description of Related Art

The markets of digital cameras, cellular phones, and MP3 players have expanded rapidly in recent years, resulting in escalated demand for storage media by consumers. Due to the characteristics of data non-volatility, low power consumption, compact size, and having no mechanical structure, rewritable non-volatile memory modules (e.g., flash memory) are suitable to be built in the various portable multimedia devices.

To ensure the accuracy of data, data stored in the rewritable non-volatile memory module may be encoded. When the data is read from the rewritable non-volatile memory module, the read data may be decoded to correct errors. However, an error floor may occur during decoding of the data, so the decoding efficiency is affected. The error floor is generally considered as resulting from a trapping set in the data. If the data has a trapping set, the number of error bits may not converge through decoding.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Exemplary embodiments of the invention provide a decoding method, a memory storage device, and a memory control circuit unit capable of facilitating decoding of data having a trapping set.

An exemplary embodiment of the invention provides a decoding method for a memory storage device including a rewritable non-volatile memory module. The rewritable non-volatile memory module includes a plurality of memory cells. The decoding method includes: transmitting a read command sequence, wherein the read command sequence instructs the rewritable non-volatile memory module to read at least one of the memory cells by using at least one read voltage level to obtain a codeword; performing a parity check operation on the codeword by an error checking and correcting circuit to generate a syndrome sum corresponding to the codeword; and dynamically adjusting a first parameter used by the error checking and correcting circuit in a first decoding operation based on whether the syndrome sum is less than a first predetermined value, and performing the first decoding operation on the codeword by the error checking and correcting circuit by using the first parameter, wherein the adjusted first parameter affects a probability that a first bit in the codeword is considered as an error bit in the first decoding operation.

Another exemplary embodiment of the invention provides a memory storage device including a connection interface unit, a rewritable non-volatile memory module, and a memory control circuit unit. The connection interface unit is coupled to a host system. The rewritable non-volatile memory module includes a plurality of memory cells. The memory control circuit unit is coupled to the connection interface unit and the rewritable non-volatile memory module. The memory control circuit unit transmits a read command sequence instructing the rewritable non-volatile memory module to read at least one of the memory cells by using at least one read voltage level to obtain a codeword. The memory control circuit unit further performs a parity check operation on the codeword to generate a syndrome sum corresponding to the codeword. The memory control circuit unit further dynamically adjusts a first parameter used in a first decoding operation based on whether the syndrome sum is less than a first predetermined value and performs the first decoding operation on the codeword by using the first parameter. The adjusted first parameter affects a probability that a first bit in the codeword is considered as an error bit in the first decoding operation.

Another exemplary embodiment of the invention provides a memory control circuit unit. The memory control circuit unit is configured to control a memory storage device. The memory storage device includes a rewritable non-volatile memory module. The rewritable non-volatile memory module includes a plurality of memory cells. The memory control circuit unit includes a host interface, a memory interface, an error checking and correcting circuit, and a memory management circuit. The host interface is coupled to a host system. The memory interface is coupled to the rewritable non-volatile memory module. The memory management circuit is coupled to the host interface, the memory interface, and the error checking and correcting circuit. The memory management circuit transmits a read command sequence instructing the rewritable non-volatile memory module to read at least one of the memory cells by using at least one read voltage level to obtain a codeword. The error checking and correcting circuit performs a parity check operation on the codeword to generate a syndrome sum corresponding to the codeword. The error checking and correcting circuit further dynamically adjusts a first parameter used in a first decoding operation based on whether the syndrome sum is less than a first predetermined value, and further performs the first decoding operation on the codeword by using the first parameter. The adjusted first parameter affects a probability that a first bit in the codeword is considered as an error bit in the first decoding operation.

Based on the above, after the codeword to be decoded is read from the rewritable non-volatile memory module, the syndrome sum corresponding to the codeword may be generated by performing the parity check operation. Then, based on whether the syndrome sum is less than the first predetermined value, the first parameter used by the error checking and correcting circuit in the first decoding operation may be dynamically adjusted, and the decoding efficiency is thus facilitated.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 9 is a schematic view illustrating a parity check operation according to an exemplary embodiment of the invention.

DESCRIPTION OF THE EMBODIMENTS

Figure 1:
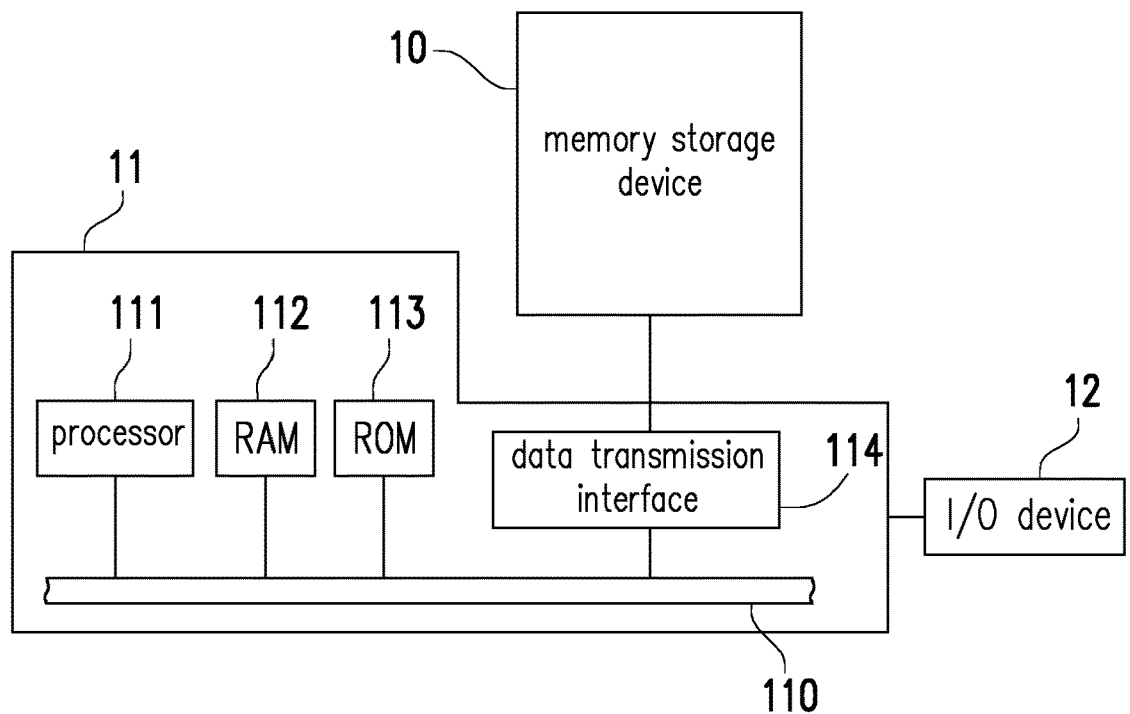
FIG. 1 is a schematic view illustrating a host system, a memory storage device, and an input/output (I/O) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (i.e., a memory storage system) includes a rewritable non-volatile memory module and a controller (i.e., a control circuit). The memory storage device is usually used together with a host system, such that the host system can write data into or read data from the memory storage device.

Figure 2:
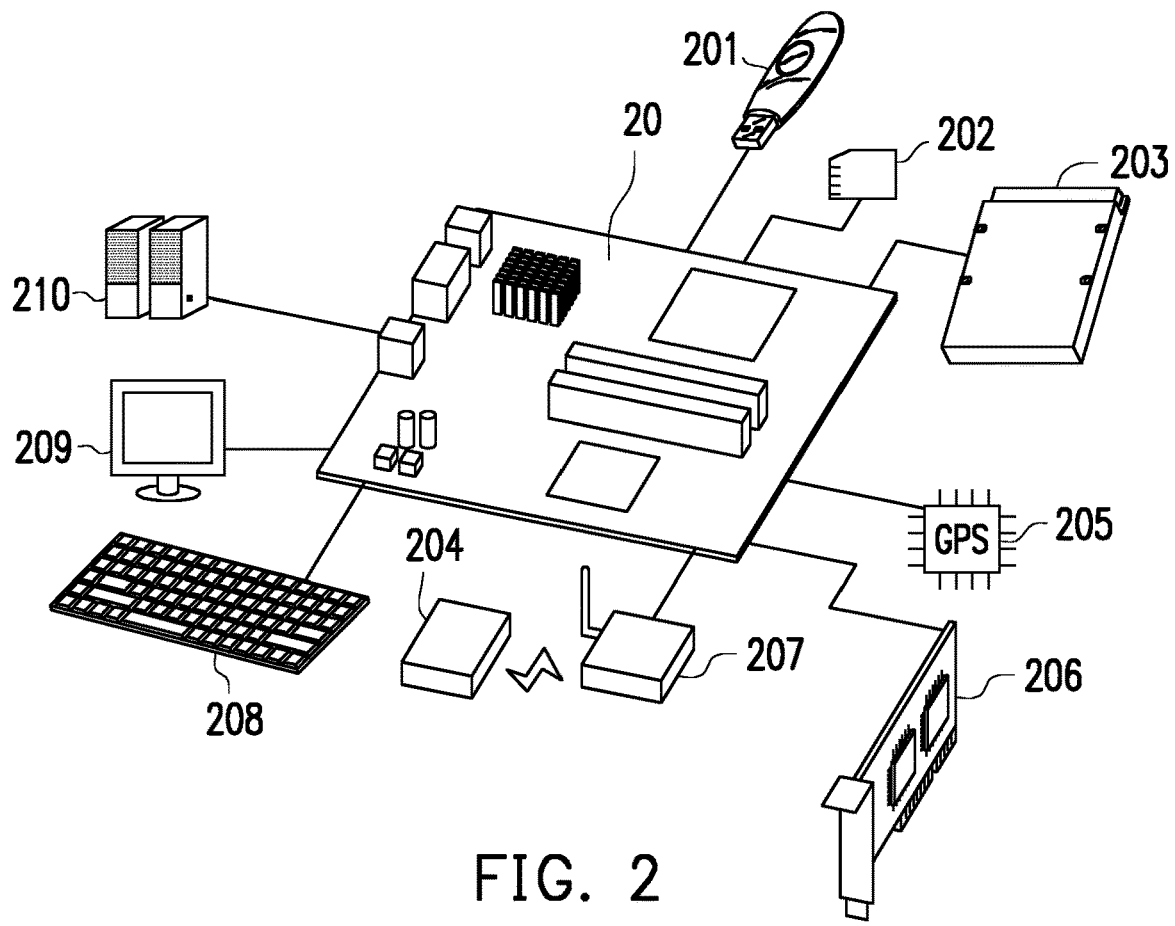
FIG. 2 is a schematic view illustrating a host system, a memory storage device, and an I/O device according to another exemplary embodiment of the invention.

FIG. 1 is a schematic view illustrating a host system, a memory storage device, and an input/output (I/O) device according to an exemplary embodiment of the invention. FIG. 2 is a schematic view illustrating a host system, a memory storage device, and an I/O device according to another exemplary embodiment of the invention. Referring to FIGS. 1 and 2, a host system 11 includes a processor 111, a random access memory (RAM) 112, a read only memory (ROM) 113, and a data transmission interface 114. The processor 111, the random access memory 112, the read only memory 113, and the data transmission interface 114 are coupled to a system bus 110.

In the present exemplary embodiment, the host system 11 is coupled to a memory storage device 10 through the data transmission interface 114. For example, the host system 11 may store data to or read data from the memory storage device 10 through the data transmission interface 114. In addition, the host system 11 is coupled to the I/O device 12 through the system bus 110. For example, the host system 11 may transmit output signals to or receive input signals from the I/O device 12 through the system bus 110.

In the present exemplary embodiment, the processor 111, the random access memory 112, the read only memory 113, and the data transmission interface 114 may be disposed on a motherboard 20 of the host system 11. One or more data transmission interfaces 114 may be provided. Through the data transmission interface 114, the motherboard 20 may be coupled to the memory storage device 10 in a wired or wireless manner. The memory storage device 10 may be a flash drive 201, a memory card 202, a solid state drive (SSD) 203, or a wireless memory storage device 204, for example. The wireless memory storage device 204 may be a memory storage device based on a various of wireless communication technologies, such as a near field communication (NFC) memory storage device, a wireless fidelity (WiFi) memory storage device, a Bluetooth memory storage device, or a Bluetooth low energy (BLE) memory storage device (e.g., iBeacon), etc. In addition, the motherboard 20 may be coupled to an I/O device of any kind, such as a global positioning system (GPS) module 205, a network interface card 206, a wireless transmission device 207, a keyboard 208, a monitor 209, a speaker 210, etc., through the system bus 110. For example, in an exemplary embodiment, the motherboard 20 may access the wireless memory storage device 204 through the wireless transmission device 207.

Figure 3:
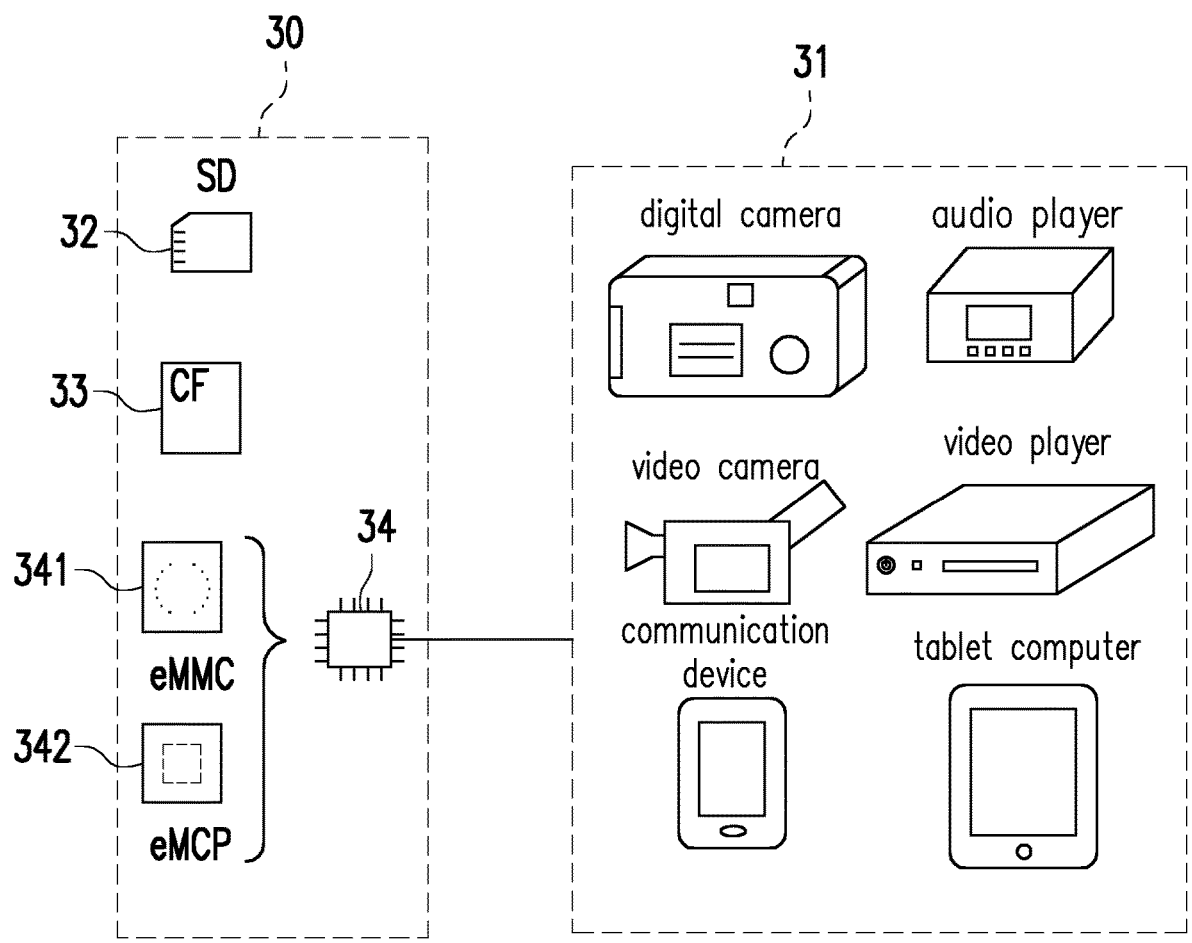
FIG. 3 is a schematic view illustrating a host system and a memory storage device according to another exemplary embodiment of the invention.

In an exemplary embodiment, the host system may be any system substantially capable of being used with a memory storage device to store data. Even though the host system is described as a computer system in the present exemplary embodiment, FIG. 3 is a schematic view illustrating a host system and a memory storage device according to another exemplary embodiment of the invention. Referring to FIG. 3, in another exemplary embodiment, a host system 31 may also be a system such as a digital camera, a video camera, a communication device, an audio player, a video player, or a tablet computer, etc., and a memory storage device 30 may be a non-volatile memory storage device of any kind, such as a secure digital (SD) card 32, a compact flash (CF) card 33, or an embedded storage device 34, etc. The embedded storage device 34 includes an embedded storage device having a memory module of any kind, such as an embedded multimedia card (eMMC) 341 and/or an embedded multi-chip package (eMCP) storage device 342, being directly coupled to a substrate of the host system.

Figure 4:
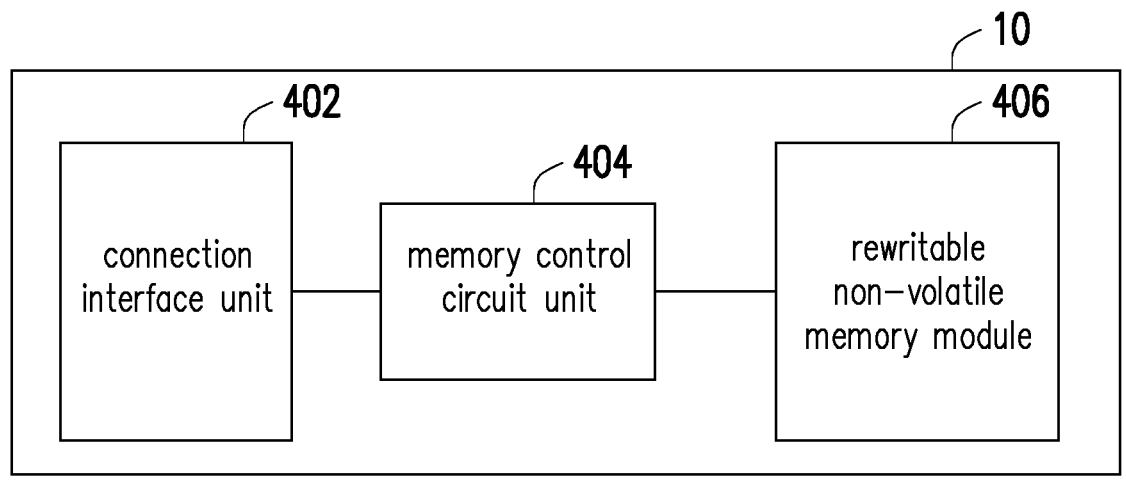
FIG. 4 is a schematic block view illustrating a memory storage device according to an exemplary embodiment of the invention.

FIG. 4 is a schematic block view illustrating a memory storage device according to an exemplary embodiment of the invention. Referring to FIG. 4, the memory storage device 10 includes a connection interface unit 402, a memory control circuit unit 404, and a rewritable non-volatile memory module 406.

The connection interface unit 402 is configured to couple the memory storage device 10 to the host system 11. In the present exemplary embodiment, the connection interface unit 402 is compatible with the serial advanced technology attachment (SATA) standard. However, the invention is not limited thereto. The connection interface unit 402 may also be compatible with the parallel advanced technology attachment (PATA) standard, the Institute of Electrical and Electronic Engineers (IEEE) 1394 standard, the peripheral component interconnect express (PCI Express) standard, the universal serial bus (USB) standard, the secure digital (SD) interface standard, the ultra high speed-I (UHS-I) interface standard, the ultra high speed-II (UHS-II) interface standard, the memory stick (MS) interface standard, the multi-chip package (MCP) interface standard, the multimedia card (MMC) interface standard, the embedded multimedia card (eMMC) interface standard, the universal flash storage (UFS) interface standard, the embedded multi-chip package (eMCP) interface standard, the compact flash (CF) interface standard, the integrated device electronics (IDE) standard, or other suitable standards. The connection interface unit 402 may be packaged with the memory control circuit unit 404 within the same chip, or the connection interface unit 402 may be disposed outside a chip that includes the memory control circuit unit 404.

The memory control circuit unit 404 executes a plurality of logic gates or control commands implemented in a hardware form or in a firmware form, and performs various data operations, such as data writing, data reading or data erasing in the rewritable non-volatile memory module 406 according to the commands issued by the host system 11.

The rewritable non-volatile memory module 406 is coupled to the memory control circuit unit 404 and the rewritable non-volatile memory module 406 stores data written by the host system 11. The rewritable non-volatile memory module 406 may be a single level cell (SLC) NAND flash memory (i.e., a flash memory module where one memory cell stores one bit), a multi-level cell (MLC) NAND flash memory module (i.e., a flash memory module where one memory cell stores two bits), a triple level cell (TLC) NAND flash memory module (i.e., a flash memory module where one memory cell stores three bits), other flash memory modules, or other memory modules with similar properties.

In each memory cell of the rewritable non-volatile memory module 406, one or more bits are stored by changing a voltage (also referred to as a threshold voltage in the following) of each memory cell. Specifically, a charge trapping layer is provided between a control gate and a channel of each memory cell. By applying a writing voltage to the control gate, the quantity of electrons of the charge trapping layer may be changed to change the threshold voltage of the memory cell. The operation of changing the threshold voltage of the memory cell is also referred to as "writing data to the memory cell" or "programming the memory cell". By changing the threshold voltage, each memory cell in the rewritable non-volatile memory module 406 may have a plurality of storage states. By applying a read voltage, which storage state a memory cell belongs to may be determined, and the one or more bits stored in the memory cell may be obtained.

In the present exemplary embodiment, the memory cells of the rewritable non-volatile memory module 406 may form a plurality of physical programming units, and the physical programming units may form a plurality of physical erasing units. Specifically, memory cells on the same word line may form one or more physical programming units. If each memory cell stores two or more bits, the physical programming units on the same word line may at least be classified into a lower physical programming unit and an upper physical programming unit. For example, a least significant bit (LSB) of a memory cell belongs to the lower physical programming unit, and a most significant bit (MSB) of a memory cell belongs to the upper physical programming unit. Generally speaking, in an MLC NAND flash memory, a writing speed of the lower physical programming unit may be higher than a writing speed of the upper physical programming unit, and/or a reliability of the lower physical programming unit may be higher than a reliability of the upper physical programming unit.

In the present exemplary embodiment, the physical programming unit is a minimum unit for programming. In other words, the physical programming unit is a minimum unit for data writing. For example, the physical programming unit may be a physical page or a physical sector. If the physical programming unit is a physical page, the physical programming units normally includes a data bit area and a redundancy bit area. The data bit area includes a plurality of physical sectors stores user data, whereas the redundancy bit area stores system data (e.g., management data such as error correcting codes). In the present exemplary embodiment, the data bit area includes 32 physical sectors, and the size of each physical sector is 512 bytes (B). However, in other exemplary embodiments, the data bit area may also include 8, 16, more, or less physical sectors, and the size of each physical sector may be greater or smaller. Besides, the physical erasing unit is a minimum unit for erasing. In other words, each physical erasing unit includes the minimum number of memory cells to be erased together. For example, the physical erasing unit is a physical block.

Figure 5:
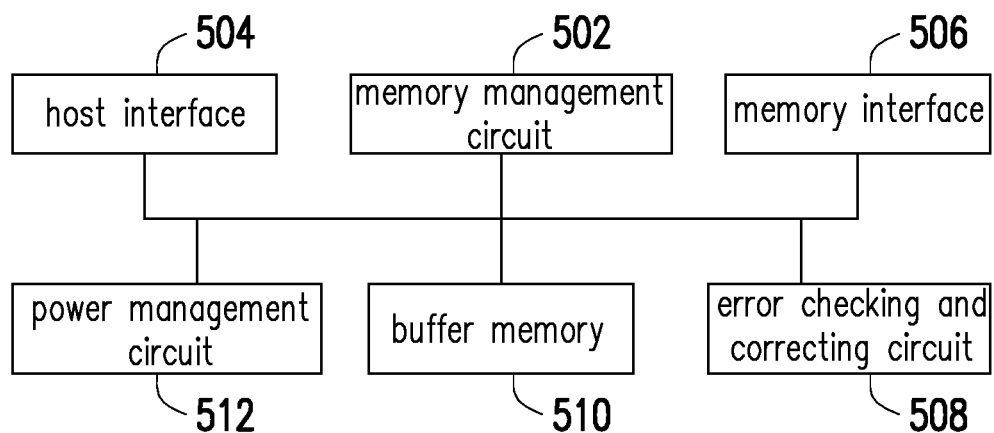
FIG. 5 is a schematic block view illustrating a memory control circuit unit according to an exemplary embodiment of the invention.

FIG. 5 is a schematic block view illustrating a memory control circuit unit according to an exemplary embodiment of the invention. Referring to FIG. 5, the memory control circuit unit 404 includes a memory management circuit 502, a host interface 504, a memory interface 506, and an error checking and correcting circuit 508.

The memory management circuit 502 controls the overall operation of the memory control circuit unit 404. Specifically, the memory management circuit 502 has a plurality of control commands. When the memory storage device 10 is operated, the control commands are executed to perform various operations such as data writing, data reading and data erasing. In the following, descriptions about the operation of the memory management circuit 502 are equivalent to descriptions about the operation of the memory control circuit unit 404.

In the present exemplary embodiment, the control commands of the memory management circuit 502 are implemented in a firmware form. For instance, the memory management circuit 502 has a microprocessor (not shown) and a read-only memory (not shown), and the control commands are burnt into the read-only memory. When the memory storage device 10 is operated, the control commands are executed by the microprocessor for performing various data operations, such as data writing, data reading or data erasing.

In another exemplary embodiment, the control commands of the memory management circuit 502 may be stored in a specific area (for example, the system area in the memory module exclusively used for storing system data) of the rewritable non-volatile memory module 406 as program codes. Moreover, the memory management circuit 502 has a microprocessor (not shown), a read-only memory (not shown), and a random access memory (not shown). Specifically, the read-only memory has a boot code. When the memory control circuit unit 404 is enabled, the boot code is firstly executed by the microprocessor to load the control commands stored in the rewritable non-volatile memory module 406 into the random access memory of the memory management circuit 502. Afterwards, the microprocessor executes the control commands for performing various data operations such as data writing, data reading and data erasing.

Additionally, in another exemplary embodiment, the control commands of the memory management circuit 502 may be implemented in a hardware form. For example, the memory management circuit 502 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microprocessor. The memory cell management circuit manages the memory cells or groups of the memory cells of the rewritable non-volatile memory module 406. The memory writing circuit issues a write command sequence to the rewritable non-volatile memory module 406 to write data into the rewritable non-volatile memory module 406. The memory reading circuit issues a read command sequence to the rewritable non-volatile memory module 406 to read data from the rewritable non-volatile memory module 406. The memory erasing circuit issues an erase command sequence to the rewritable non-volatile memory module 406 to erase data from the rewritable non-volatile memory module 406. The data processing circuit processes data to be written to and data to be read from the rewritable non-volatile memory module 406. Each of the write command sequence, the read command sequence, and the erase command sequence may include one or more program codes or command codes configured to instruct the rewritable non-volatile memory module 406 to perform a corresponding writing, reading, or erasing operation. In the exemplary embodiment, the memory management circuit 502 may further issue a command sequence of another type to the rewritable non-volatile memory module 406 to instruct to perform a corresponding operation.

The memory management circuit 502 may logically assign a plurality of physical units of the rewritable non-volatile memory module 406 into a storage area and a replacement area. The physical units in the storage area is configured to store data, whereas the physical units in the replacement area is configured to replace damaged physical units in the storage area. For example, if data read from one of the physical units includes too many errors and is thus not correctable, the physical unit may be considered as a damaged physical unit. If there is no physical unit available in the replacement area, the memory management circuit 502 may declare that the whole memory storage device 10 enters a write protect state where no further data can be written into the memory storage device 10.

In the present exemplary embodiment, a physical unit refers to a physical erasing unit. However, in another exemplary embodiment, a physical unit may also refer to a physical address, a physical programming unit, or a combination of a plurality of continuous or discontinuous physical addresses. The memory management circuit 502 may assign a plurality of logical units to map the physical units in the storage area. In the present exemplary embodiment, a logical unit refers to a logical address. However, in another exemplary embodiment, a logical unit may also refer to a logical programming unit, a logical erasing unit, or a combination of a plurality of continuous or discontinuous logical addresses. In addition, each of the logical units may be mapped to one or more physical units.

The memory management circuit 502 may record mapping relationships between the logical units and the physical units in at least one logical-physical address mapping table. When the host system 11 intends to read data from or write data to the memory storage device 10, the memory management circuit 502 may perform a data access operation on the memory storage device 10 based on the logical-physical address mapping table.

The host interface 504 is coupled to the memory management circuit 502 and configured to receive and identify commands and data transmitted from the host system 11. In other words, the commands and the data transmitted from the host system 11 may be transmitted to the memory management circuit 502 through the host interface 504. In the present exemplary embodiment, the host interface 504 is compatible with the SATA standard. However, it should be understood that the invention is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the USF standard, the CF standard, the IDE standard, or other suitable standards for data transmission.

The memory interface 506 is coupled to the memory management circuit 502 for accessing the rewritable non-volatile memory module 406. In other words, data to be written into the rewritable non-volatile memory module 406 is converted into a format acceptable to the rewritable non-volatile memory module 406 through the memory interface 506. Specifically, if the memory management circuit 502 intends to access the rewritable non-volatile memory module 406, the memory interface 506 may transmit corresponding command sequences. For example, the command sequences may include a write command sequence instructing to write data, a read command sequence instructing to read data, an erase command sequence instructing to erase data, and other command sequences instructing various memory operations, such as changing a read voltage level, executing a garbage collection operation, or the like. The command sequences are generated by the memory management circuit 502, for example, and are transmitted to the rewritable non-volatile memory module 406 through the memory interface 506. The command sequences may include one or more signals or data on a bus. These signals or data may include command codes or program codes. For example, the read command sequence may include information such as an identification code for reading, a memory address, and/or the like.

The error checking and correcting circuit 508 is coupled to the memory management circuit 502 and configured to perform an error checking and correcting operation to ensure the accuracy of data. Specifically, when the memory management circuit 502 receives a write command from the host system 11, the error checking and correcting circuit 508 may generate a corresponding error correcting code (ECC) and/or a corresponding error detecting code (EDC) in correspondence with data corresponding to the write command. In addition, the memory management circuit 502 may write the data corresponding to the write command and the corresponding ECC and/or the corresponding EDC to the rewritable non-volatile memory module 406. Then, when the memory management circuit 502 reads the data from the rewritable non-volatile memory module 406, the memory management circuit 502 may simultaneously read the ECC and/or EDC corresponding to the data, and the error checking and correcting circuit 508 may perform the error checking and correcting operation on the read data based on the ECC and/or the EDC.

In an exemplary embodiment, the memory control circuit unit 404 may further include a buffer memory 510 and a power management circuit 512.

The buffer memory 510 is coupled to the memory management circuit 502 and configured to temporarily store data and commands from the host system 11 or data from the rewritable non-volatile memory module 406. The power management circuit 512 is coupled to the memory management circuit 502 and configured to control the power of the of the memory storage device 10.

It is noted that in the following description, some terms may be replaced with corresponding abbreviations for ease of reading (see Table 1).

TABLE 1

| rewritable non-volatile memory module | RNVM module |
| memory management circuit | MMC |
| error checking and correcting circuit | ECCC |
| read voltage level | RVL |

In the present exemplary embodiment, the ECCC 508 supports the low-density parity-check (LDPC) code. For example, the ECCC 508 may encode and decode by using the LDPC code. However, in another exemplary embodiment, the ECCC 508 may also support the BCH code, the convolutional code, the turbo code, or the like. The invention does not intend to impose a limitation on this regard.

In the LDPC code, a valid codeword is defined by using a parity-check matrix. In the following, the parity-check matrix is labeled as a matrix H, and a codeword is labeled as CW. According to an equation (1) in the following, if a result of multiplication of the parity-check matrix H by the codeword CW is zero vector, the codeword CW is a valid codeword, wherein an operator ⊗ represents a mod 2 matrix multiplication. In other words, a null space of the matrix H includes all the valid codewords. However, the invention does not intend to limit contents of the codeword CW. For instance, the codeword CW may also include the ECC or the EDC generated by any algorithm.

$$H \otimes CW^T = 0 \quad (1)$$

In the equation (1), a dimension of the matrix H is k-by-n, and a dimension of the codeword CW is 1-by-n, where k and n are positive integers. The codeword CW includes message bits and parity bits. Namely, the codeword CW may be represented by [M P], in which a vector M is constituted by the message bits, and a vector P is constituted by the parity bits. A dimension of the vector M is 1-by-(n–k), and a dimension of the vector P is 1-by-k. Hereinafter, the message bits and the parity bits are collectively referred to as data bits. In other words, the codeword CW includes n data bits, in which a length of the message bits is (n–k) bits, a length of the parity bits is k bits, and a code rate of the codeword CW is (n–k)/n.

Generally, a generation matrix (labeled as G hereinafter) is used during encoding, so that an equation (2) below may be satisfied by arbitrary values of the vector M. In the equation (2), a dimension of the generation matrix G is (n–k)-by-n.

$$M \otimes G = [MP] = CW \quad (2)$$

The codeword CW generated by the equation (2) is a valid codeword. Therefore, when the equation (2) is substituted into the equation (1), an equation (3) below may be obtained accordingly.

$$H \otimes G^T \otimes M^T = 0 \quad (3)$$

Since the vector M may be arbitrary vectors, an equation (4) below is definitely satisfied. In other words, after the parity check matrix H is decided, the corresponding generation matrix G may also be decided.

$$H \otimes G^T = 0 \quad (4)$$

When decoding the codeword CW, a parity check operation is firstly executed on the data bits in the codeword. For example, the parity check matrix H may be multiplied by the codeword CW to generate a vector (the vector is labeled as S in the following, as shown in an equation (5) below). If the vector S is the zero vector, the codeword CW may be directly output. If the vector S is not the zero vector, it is indicated that the codeword CW is not a valid codeword.

$$H \otimes CW^T = S \quad (5)$$

A dimension of the vector S is k-by-1, in which each element is also referred to as a syndrome. If the codeword CW is not a valid codeword, the ECCC 508 may execute a decoding operation for attempting to correct the error (i.e., the error bit) in the codeword CW.

Figures 6, 7:
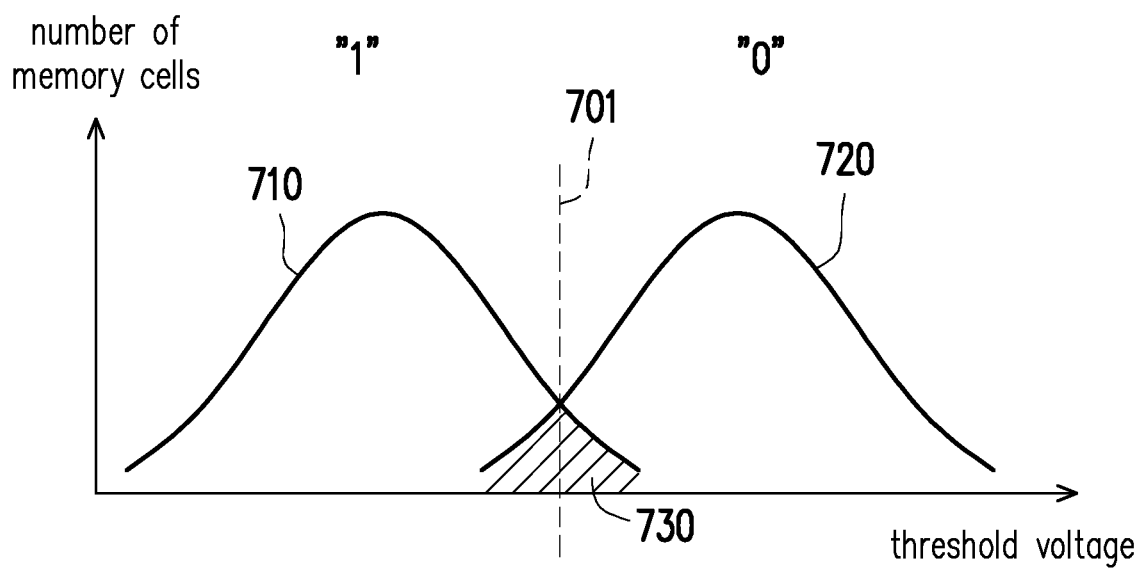
FIG. 6 is a schematic view illustrating a parity check matrix according to an exemplary embodiment of the invention.
FIG. 7 is a schematic view illustrating a threshold voltage distribution of memory cells according to an exemplary embodiment of the invention.

FIG. 6 is a schematic view illustrating a parity check matrix according to an exemplary embodiment of the invention. Referring to FIG. 6, a dimension of a parity-check matrix 600 is k-by-n. As an example, k is 8 and n is 9. However, the invention does not intend to limit the values of k and n.

Each row of the parity-check matrix 600 also represents a constraint. Taking the first row of the parity-check matrix 600 as an example, if a codeword is a valid codeword, a bit "0" is obtained after a mod 2 addition is performed on the third, fifth, eighth, and ninth bits. People having ordinary skill in the art shall appreciate how encoding and decoding are carried out by using the parity-check matrix 600. Therefore, details in this regard will not be repeated in the following. Besides, the parity-check matrix 600 is merely described as an exemplary matrix and shall not be construed as a limitation on the invention.

When the MMC 502 is about to store a plurality of bits to the RNVM module 406, the ECCC 508 may correspondingly generate k parity bits for each (n-k) bits (i.e., message bits). Subsequently, the MMC 502 may write the n bits (i.e., data bits) as a codeword into the RNVM module 406.

FIG. 7 is a schematic view illustrating a threshold voltage distribution of memory cells according to an exemplary embodiment of the invention. Referring to FIG. 7, a horizontal axis represents the threshold voltages of the memory cells, and a vertical axis represents the number of the memory cells. For example, FIG. 7 may represent the threshold voltages of the respective memory cells in a physical programming unit.

Assuming that a state 710 corresponds to the bit "1", and a state 720 corresponds to the bit "0", if the threshold voltage of a memory cell belongs to the state 710, the bit "1" is stored in the memory cell, and comparatively, if the threshold voltage of a memory cell belongs to the state 720, the bit "0" is stored in the memory cell. It should be noted that, in the present exemplary embodiment, a state in the threshold voltage distribution corresponds to one bit value, and the threshold voltage distribution of the memory cells include two possible states. However, in other exemplary embodiments, each state in the threshold voltage distribution may also correspond to a plurality of bit values, and the threshold voltage distribution of the memory cells may include four, eight, or an arbitrary number of states. Besides, the invention does not intend to impose a limitation on the bits represented by the respective states. For example, in another exemplary embodiment of FIG. 7, the state 710 may also correspond to the bit "0", and the state 720 may represent the bit "1".

In the present exemplary embodiment, when it is intended to read data from the RNVM module 406, the MMC 202 may transmit a read command sequence to the RNVM module 406. The read command sequence instructs the RNVM module 406 to read at least one memory cell (also referred to as first memory cell) by using at least one RVL, so as to obtain the data stored in the first memory cell. For example, based on the read command sequence, the RNVM module 406 may read the first memory cells by using a RVL 701 in FIG. 7. If the threshold voltage of one of the first memory cells is lower than the RVL 701, the memory cell may be turned on, and the MMC 502 may read the bit "1". Alternatively, if the threshold voltage of one of the first memory cells is higher than the RVL 701, the memory cell may be turned off, and the MMC 502 may read the bit "0". The read bit data may form one or more codewords.

In the present exemplary embodiment, there is an overlapped region 730 between the state 710 and the state 720. The overlapped region 730 indicates that the bits stored in some memory cells of the first memory cells should be the bit "1" (i.e., belonging to the state 710), but the threshold voltages of these memory cells are higher than the RVL 701 that is applied, and the bits stored in some memory cells of the first memory cells should be the bit "0" (i.e., belonging to the state 720), but the threshold voltages of these memory cells are lower than the RVL 701 that is applied. In other words, some bits may be erroneous in the data read by applying the RVL 701.

In general, if the first memory cells are only used for a short period of time (e.g., the data is not stored in the first memory cells for a long while) and/or a frequency of use of the first memory cells is low (e.g., a read count, a write count, and/or an erase count of the first memory cells is not large), a size of the overlapped region 730 is normally small, or the overlapped region 730 may even not exist (i.e., the states 710 and 720 are not overlapped). Also, if the memory storage device 10 is just shipped out of the factory, the overlapped region 730 normally does not exist. If the size of the overlapped region 730 is small, the data read from the first memory cells by applying the RVL 701 usually includes fewer error bits.

Nevertheless, as the RNVM module 406 is used for a longer while or used more frequently, the size of the overlapped region 730 may gradually increase. For example, if the first memory cells are used for a long period of time (e.g., the data is stored in the first memory cells for a long while) and/or the frequency of use of the first memory cells is high (e.g., the read count, the write count, and/or the erase count of the first memory cells is large), the size of the overlapped region 730 may become larger. For example, the states 710 and 720 may be in flatter shapes and/or the states 710 and 720 may be closer to each other. If the size of the overlapped region 730 is large, the data read from the first memory cells by applying the RVL 701 may include more error bits. Therefore, after receiving the read data from the RNVM module 406, the ECCC 508 may perform the parity-check operation to verify whether the data includes an error. If it is determined that the data includes the error, the ECCC 508 may perform the decoding operation to correct the error.

In the present exemplary embodiment, the ECCC 508 performs an iteration decoding operation. The iteration decoding operation decodes the data read from the RNVM module 406. For example, a decoding unit in the data may be a codeword. In the iteration decoding operation, the parity-check operation configured for checking the accuracy of the data and the decoding operation configured for correcting the errors may be performed repetitively and alternately, until decoding succeeds or the number of iterations reaches a predetermined number. The number of iterations reaching the predetermined number indicates that the decoding fails, and the ECCC 508 may stop decoding. Besides, if the parity-check operation determines that the data does not include any error, the ECCC 508 may stop decoding and output the successfully decoded data.

Figure 8:
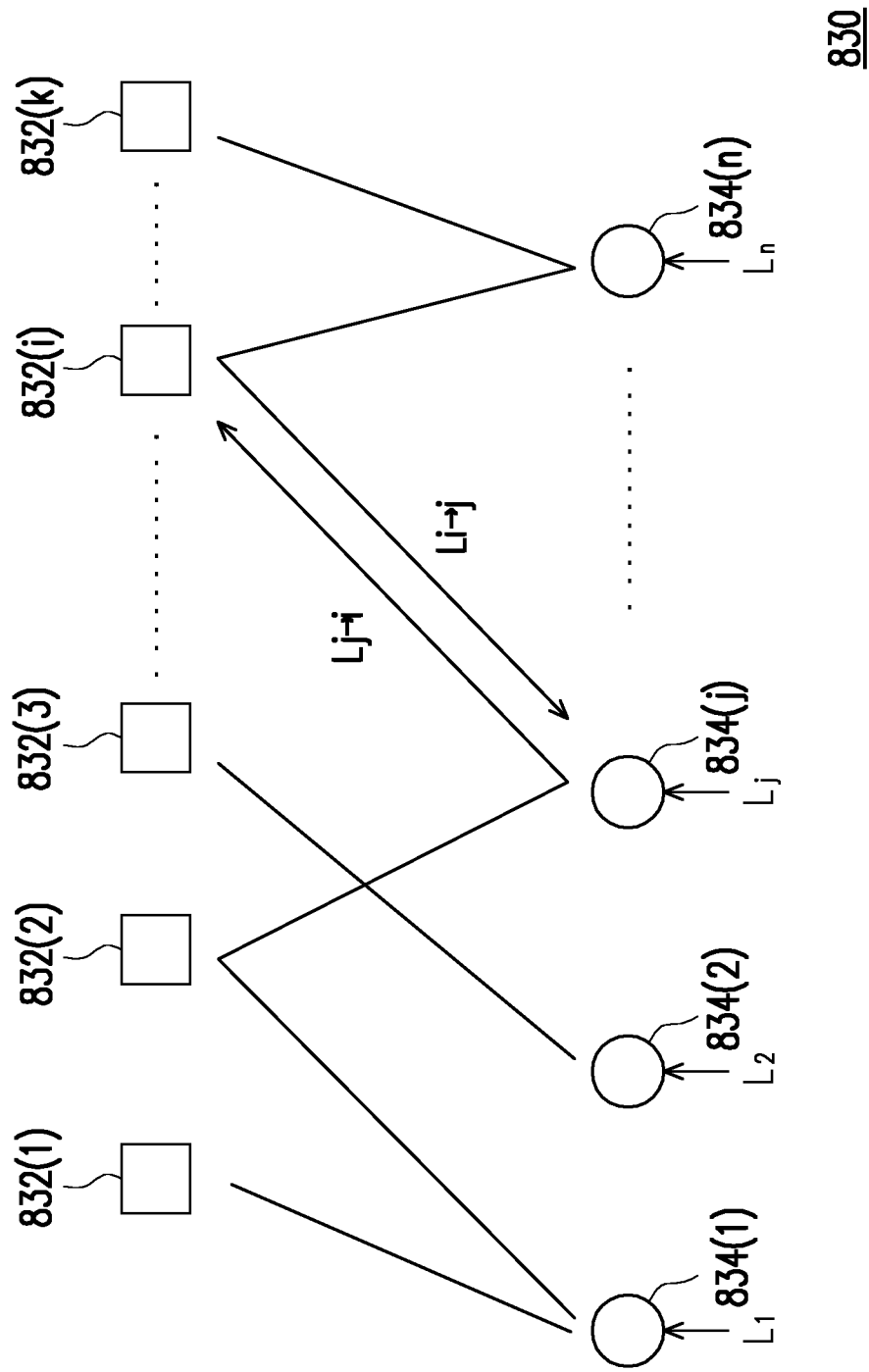
FIG. 8 is a schematic view illustrating a bipartite graph according to an exemplary embodiment of the invention.

FIG. 8 is a schematic view illustrating a bipartite graph according to an exemplary embodiment of the invention. Referring to FIG. 8, in general, the parity-check matrix H may be represented as a bipartite graph 830 including parity nodes 832(1) to 832(k) and message nodes 834(1) to 834(n). Each of the parity nodes 832(1) to 832(k) corresponds to a syndrome, and each of the message nodes 834(1) to 834(n) corresponds to a data bit. Corresponding relationships between the data bits and the syndromes (i.e., connections between the message nodes 834(1) to 834(n) and the parity nodes 832(1) to 832(k)) are generated according to the parity-check matrix H. Specifically, if an element at the $i^{th}$ row and the $j^{th}$ column of the parity-check matrix H is 1, the $i^{th}$ parity node 832(i) is connected to the $j^{th}$ message node 834(j), where i and j are positive integers.

When the MMC 502 reads n data bits (to form a codeword) from the RNVM module 406, the MMC 502 also obtains reliability information (also referred to as channel reliability information) of each data bit. The reliability information represents a probability (also referred to as confidence level) that the corresponding data bit is decoded into the bit "1" or "0". In the bipartite graph 830, the message nodes 834(1) to 834(n) also receive the corresponding reliability information. For example, the message node 832(1) may receive reliability information L1 of the first data bit, and the message node 832(j) may receive reliability information $L_j$ of the $j^{th}$ data bit.

The ECCC 508 may perform the decoding operation based on the structure of the bipartite graph 830 and the reliability information $L_1$ to $L_n$. For example, the decoding operation includes iteration decoding. In the iteration decoding, the message nodes $834(1)$ to $834(n)$ may calculate the reliability information for the parity nodes $832(1)$ to $832(k)$, and the parity nodes $832(1)$ to $832(k)$ may also calculate the reliability information for the message nodes $834(1)$ to $834(n)$. The reliability information may be transmitted along edges in the bipartite graph 830. For example, the parity node $832(i)$ transmits the reliability information $L_{i \to j}$ to the message node $834(j)$, and the message node $834(j)$ transmits the reliability information $L_{j \to i}$ to the parity node $832(i)$. The reliability information represents the probability (i.e., confidence level) that a data bit is decoded into "1" or "0" asserted at node. For example, the reliability information $L_{j \to i}$ represents that the confidence level (may be positive or negative) that the $j^{th}$ data bit is decoded into "1" or "0" asserted at the message node $834(j)$, and the reliability information $L_{i \to j}$ represents that the confidence level that the $j^{th}$ data bit is decoded into "1" or "0" asserted at the parity node $832(i)$. Besides, the message nodes $834(1)$ to $834(n)$ and the parity nodes $832(1)$ to $832(k)$ calculate the output reliability information based on the input reliability information. The calculation is similar to calculating a conditional probability that a data bit is decoded into "1" or "0". Therefore, a process of transmitting the reliability information is also referred to as belief propagation.

After the parity-check operation is performed on the data bits (e.g., multiplying the codeword formed by the data bits by the parity-check matrix), whether the codeword is a valid codeword is determined. If the generated codeword is a valid codeword, it represents that the decoding is successful and the iteration decoding is stopped. However, if the generated codeword is not a valid codeword, the next iteration is carried out. If the number of iterations of the iteration decoding reaches the predetermined value, it is determined that the decoding fails and the iteration decoding is stopped.

In the present exemplary embodiment, the reliability information includes a log likelihood ratio (LLR). For example, the reliability information $L_1$ to $L_n$, $L_{i \to j}$, and $L_{j \to i}$ in FIG. 8 may respectively be LLR. In general, the greater an absolute value of the LLR (may be positive or negative) corresponding to a data bit is, the higher the reliability of the data bit is, such that there is a higher probability that the current bit value of the data bit is considered as correct. On the contrary, the lower the absolute value of the LLR corresponding to a data bit is, the lower the reliability of the data bit is, such that there is higher probability that the current bit value of the data bit is considered as incorrect and may be corrected in the current iteration decoding. In an exemplary embodiment, the reliability information (e.g., LLR) used in the iteration decoding may be obtained by looking up a table. However, in another exemplary embodiment, the reliability information used in the iteration decoding may also be generated by dynamically calculating in the iteration decoding based on a specific algorithm. Furthermore, based on different algorithms, the message nodes $834(1)$ to $834(n)$ and/or the parity nodes $832(1)$ to $832(k)$ may also calculate the reliability information of different types and the reliability information is not limited to LLR.

FIG. 9 is a schematic view illustrating a parity check operation according to an exemplary embodiment of the invention. Referring to FIG. 9, assuming that the data read from the first memory cells includes a codeword 901, based on the equation (5), the codeword 901 may be multiplied by a parity-check matrix 900 to generate a syndrome vector 902 (i.e., the vector S) in the parity-check operation. Each bit in the codeword 901 corresponds to at least one element (i.e., syndrome) of the syndrome vector 902. For example, a bit $V_0$ (corresponding to a first column of the parity-check matrix 900) in the codeword 901 corresponds to syndromes $S_1$, $S_4$, and $S_7$, and a bit $V_1$ (corresponding to a second column of the parity-check matrix 900) corresponds to syndromes $S_2$, $S_3$, and $S_6$. Based on the same principle, a bit $V_8$ (corresponding to a ninth column of the parity-check matrix 900) corresponds to syndromes $S_0$, $S_4$, and $S_5$. If the bit $V_0$ is an error bit, at least one of the syndromes $S_1$, $S_4$, and $S_7$ may be "1". If the bit $V_1$ is an error bit, at least one of the syndromes $S_2$, $S_3$, and $S_6$ may be "1". Based on the same principle, if the bit $V_8$ is an error bit, at least one of the syndromes $S_0$, $S_4$, and $S_5$ may be "1".

In other words, if the syndromes $S_0$ to $S_7$ are all "0", the codeword 901 may not include any error bit, so the ECCC 508 may directly output the codeword 901. However, if the codeword 901 includes at least one error bit, at least one of the syndromes $S_0$ to $S_7$ may be "1", and the ECCC 508 may perform the decoding operation on the codeword 901.

The ECCC 508 may support one or more decoding algorithms. In an exemplary embodiment, the ECCC 508 may perform the decoding operation by using a bit flipping algorithm. Based on the bit flipping algorithm, the ECCC 508 may identify a bit requiring flipping (also referred to as a bit to be flipped) in the data based on a flipping threshold value.

Referring to FIG. 9, in a decoding operation using the bit flipping algorithm, the ECCC 508 may calculate a syndrome weight corresponding to each bit in the codeword 901 based on the parity-check matrix 900 and the syndrome vector 902. For example, the ECCC 508 may add up the syndromes corresponding to the same bit in the codeword 901 to obtain the syndrome weight corresponding to the bit. For example, a syndrome weight corresponding to the bit $V_0$ may be equal to a sum of the syndromes $S_1$, $S_4$, and $S_7$ added up, and a syndrome weight corresponding to the bit $V_1$ may be equal to a sum of the syndromes $S_2$, $S_3$, and $S_6$ added up. Based on the same principle, a syndrome weight corresponding to the bit $V_8$ may be equal to a sum of the syndromes $S_0$, $S_4$, and $S_5$ added up. It should be noted that the additions of the syndromes $S_0$ to $S_7$ are normal additions, and not mod 2 additions. For example, the ECCC 508 may obtain the syndrome weight corresponding to each bit in the codeword 901 based on an equation (6) below. In the equation (6), each element in a vector f represents the syndrome weight corresponding to each bit in the codeword.

$$f = S^T \times H \qquad (6)$$

After the syndrome weight corresponding to each bit of the codeword is generated, if the syndrome weight corresponding to one specific bit is greater than the flipping threshold value that is set, the bit may be considered as an error bit and may be flipped. For example, if the flipping threshold value is "3", and a syndrome weight corresponding to the bit $V_3$ in the codeword 901 is greater than "3", the ECCC 508 may flip the bit $V_3$. Alternatively, if the flipping threshold value is "2", and syndrome weights corresponding to the bits $V_1$ and $V_3$ in the codeword 901 are both greater than "2", the ECCC 508 may flip the bits $V_1$ and $V_3$. It should be noted that flipping a bit here refers to changing a bit value of the bit (i.e., the bit to be flipped) from "1" to "0" or from "0" to "1".

In an exemplary embodiment, the ECCC 508 may also support another decoding algorithm, such as a min-sum algorithm, a sum-product algorithm, or the like and the applicable decoding algorithm is not limited to those described in the foregoing. After determining that the data includes an error, the ECCC 508 may perform the decoding operation based on a specific decoding algorithm. The decoding operation may be carried out based on the exemplary embodiment of FIG. 8. People having ordinary skills in the art shall appreciate how data is decoded by using the bit flipping algorithm, the min-sum algorithm, and/or the sum-product algorithm, so details in this regard will not be repeated in the following. In addition, in an exemplary embodiment, two decoding operations successively executed by the ECCC 508 may be based on the same or different algorithms. The invention does not intend to impose a limitation on this regard.

In general, if at least one decoding operation is performed on the same codeword, the errors in the codeword may gradually decrease (also referred to as convergence of errors). Eventually, a valid codeword without any error bit is generated. However, under some circumstances, such as the data to be decoded including a trapping set, the total number of error bits in the codeword may not be decreased no matter how many times the decoding operations is repetitively performed. In an exemplary embodiment, the case when the data to be decoded includes a trapping set so the errors do not converge is also referred to as an "error floor". When the error floor occurs, if the data is repetitively decoded based on predetermined decoding rules, there is a high probability that the decoding may fail because of an excessive number of times of decoding.

In an exemplary embodiment of the invention, the MMC 502 may identify whether the error floor may occur in a current or future decoding operation performed on a codeword based on a syndrome sum of the codeword. If the MMC 502 determines that the error floor may occur in the current or future decoding operation performed on the codeword, the MMC 502 may dynamically adjust a decoding parameter (also referred to as a first parameter) used by the ECCC 508 in a decoding operation (also referred to as a first decoding operation). The adjusted first parameter may affect a probability that at least part of bits (also referred to as first bits) in the codeword are considered as error bits (or bits to be flipped) in the first decoding operation. Then, the ECCC 508 may perform the first decoding operation on the codeword by using the adjusted first parameter. In an exemplary embodiment, performing the first decoding operation on the codeword by using the adjusted first parameter is able to effectively deal with the occurrence of the error floor during the decoding operation. Several exemplary embodiments are provided in the following to further describe details of relevant operations.

First Exemplary Embodiment

Figure 10:
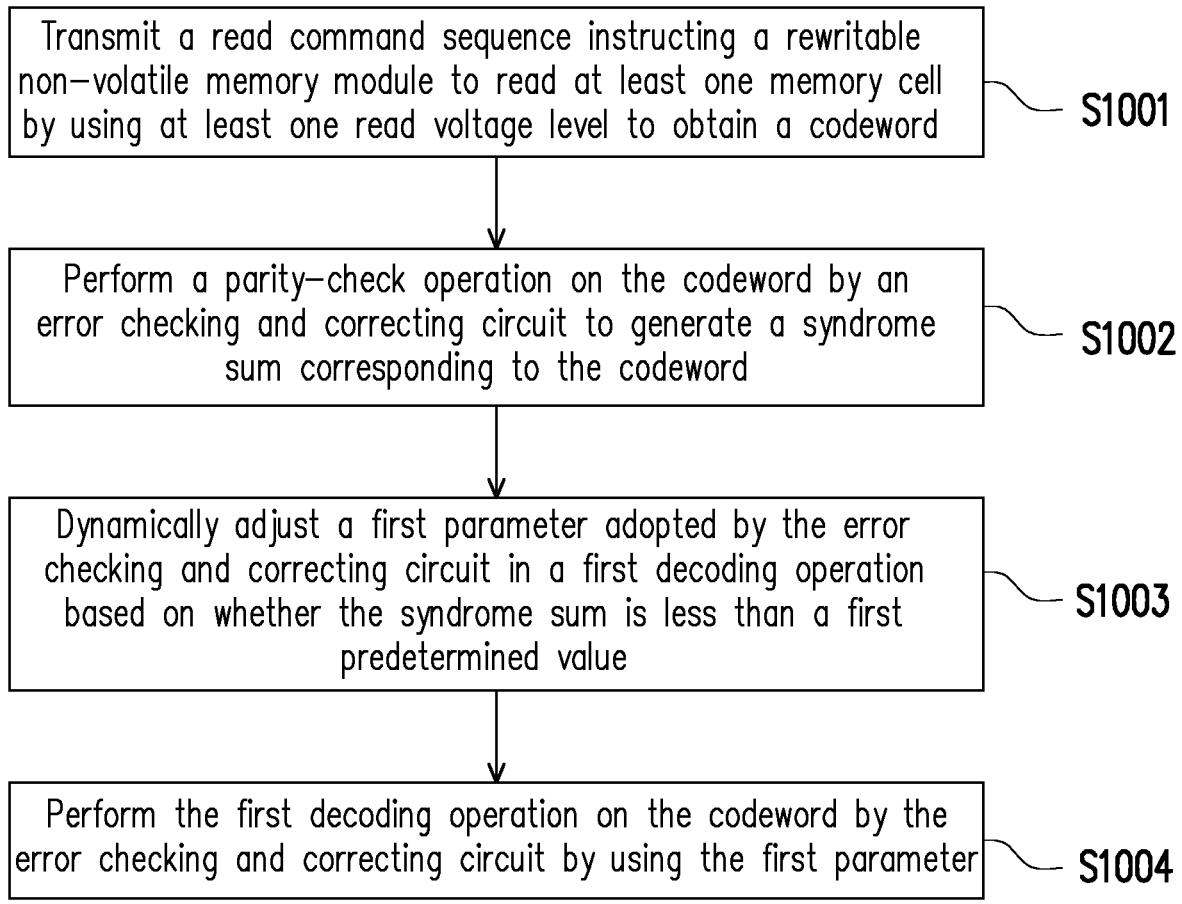
FIG. 10 is a flowchart illustrating a decoding method according to a first exemplary embodiment of the invention.

FIG. 10 is a flowchart illustrating a decoding method according to a first exemplary embodiment of the invention. Referring to FIGS. 9 and 10, at Step S1001, the MMC 502 transmits the read command sequence to the RNVM module 406 to instruct the RNVM module 406 to read at least one memory cell by using at least one RVL to obtain at least one codeword. For the ease of description, the following exemplary embodiment is only described by using the codeword 901 in FIG. 9 as an example.

At Step S1002, the ECCC 508 performs the parity-check operation on the codeword 901 to generate a syndrome sum corresponding to the codeword 901. For example, after generating the syndrome vector 902, the MMC 502 may add up the syndromes $S_0$ to $S_7$ in the syndrome vector 902 to obtain the syndrome sum corresponding to the codeword 901. In other words, the syndrome sum corresponding to the codeword 901 may be equal to the sum of the syndromes $S_0$ to $S_7$. At Step S1003, the MMC 502 may dynamically adjust the first parameter used by the ECCC 508 in the first decoding operation based on whether the syndrome sum corresponding to the codeword 901 is less than a predetermined value (also referred to as a first predetermined value). For example, based on whether the syndrome sum corresponding to the codeword 901 is less than the first predetermined value, the MMC 502 may determine to adjust or not adjust the first parameter or determine a specific adjustment means to adjust the first parameter. For example, the first predetermined value may be 50, greater than 50, or less than 50. Then, at Step S1004, the ECCC 508 may perform the first decoding operation on the codeword 901 by using the first parameter.

It should be noted that, in the first exemplary embodiment, the first decoding operation may be performed by using various LDPC decoding algorithms, such as the bit flipping algorithm, the min-sum algorithm, or the sum-product algorithm, or other types of decoding algorithms. The invention does not intend to impose a limitation on this regard. Besides, the adjusted first parameter may include various types of parameters that the ECCC 508 may use in the first decoding operation, as long as the adjusted first parameter affects the probability that at least a part of bits (also referred to as first bit) in the codeword is considered as error bit (or bit to be flipped) in the first decoding operation.

From another perspective, in the first exemplary embodiment, the MMC 502 is able to effectively identify whether the error floor may occur in the current or future decoding operation performed on the codeword 901 based on whether the syndrome sum corresponding to the codeword 901 is less than the first predetermined value. For example, if the syndrome sum corresponding to the codeword 901 is less than the first predetermined value, the MMC 502 may determine that there is a high probability that the error floor may occur in the current or future decoding operation on the codeword 901. Therefore, the MMC 502 may dynamically adjust the first parameter to a suitable value to deal with or eliminate the issue that the error floor occurs in the future decoding operation. Comparatively, if the syndrome sum corresponding to the codeword 901 is not less than the first predetermined value, the MMC 502 may determine that the probability that the error floor occurs in the current or decoding operation on the codeword 901 is not high. Therefore, the MMC 502 may not require an adjustment to the first parameter or may adjust the first parameter based on the predetermined rules. It should be noted that the adjusting of the first parameter based on the predetermined rules here refers to an adjustment to the first parameter according to a predetermined parameter adjustment mechanism of a whole decoding procedure, instead of specifically making to deal with the error floor.

Second Exemplary Embodiment

Figure 11:
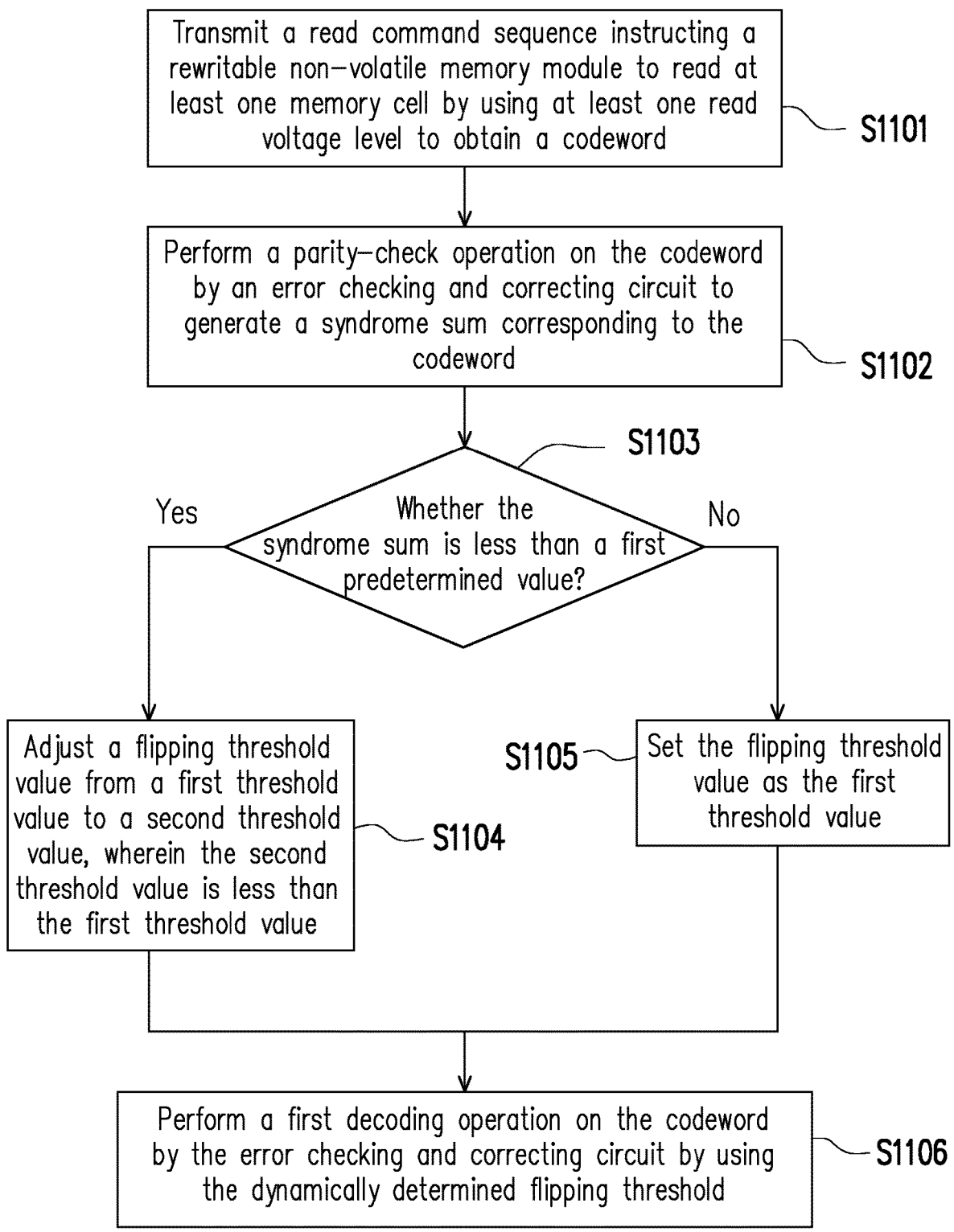
FIG. 11 is a flowchart illustrating a decoding method according to a second exemplary embodiment of the invention.

FIG. 11 is a flowchart illustrating a decoding method according to a second exemplary embodiment of the invention. It should be noted that, in the second exemplary embodiment, the ECCC 508 performs the first decoding operation by using the bit flipping algorithm, and the first parameter includes a flipping threshold value configured to determine the bit to be flipped in the bit flipping algorithm.

Referring to FIGS. 9 and 11, at Step S1101, the MMC 502 transmits the read command sequence to the RNVM module 406 to instruct the RNVM module 406 to read at least one memory cell by using at least one RVL to obtain the codeword 901. At Step S1102, the ECCC 508 performs the parity-check operation on the codeword 901 to generate the syndrome sum corresponding to the codeword 901 (e.g., the sum of the syndromes $S_0$ to $S_7$).

At Step S1103, the MMC 502 determines whether the syndrome sum corresponding to the codeword 901 is less than the first predetermined value. If the syndrome sum corresponding to the codeword 901 is less than the first predetermined value, at Step S1104, the MMC 502 adjusts the flipping threshold value from a value (also referred from a first threshold value) to another value (also referred to as a second threshold value). The second threshold value (e.g., 2) is less than the first threshold value (e.g., 3). However, if the syndrome sum corresponding to the codeword 901 is not less than the first predetermined value, at Step S1105, the MMC 502 may set the flipping threshold value as the first threshold value (e.g., 3). At Step S1106, the ECCC 508 performs the first decoding operation on the codeword 901 by using the dynamically determined flipping threshold value.

In other words, in the second exemplary embodiment, if the syndrome sum corresponding to the codeword 901 is less than the first predetermined value, it presents that there is a higher probability that the error floor may occur in the decoding operation for the codeword 901. Therefore, the flipping threshold value used in the decoding operation may be lowered. For example, by lowering the flipping threshold value correspondingly used in the first decoding operation, the probabilities of flipping of at least some bits in the first decoding operation are increased. Therefore, the probability of occurrence of the error floor is reduced, or the issue of the error floor is dealt with. Comparatively, if the syndrome sum corresponding to the codeword 901 is not less than the first predetermined value, it represents that the probability that the error floor occurs in the decoding operation of the codeword 901 is not high, so the flipping threshold value may not require an adjustment for the error floor.

Third Exemplary Embodiment

Figure 12:
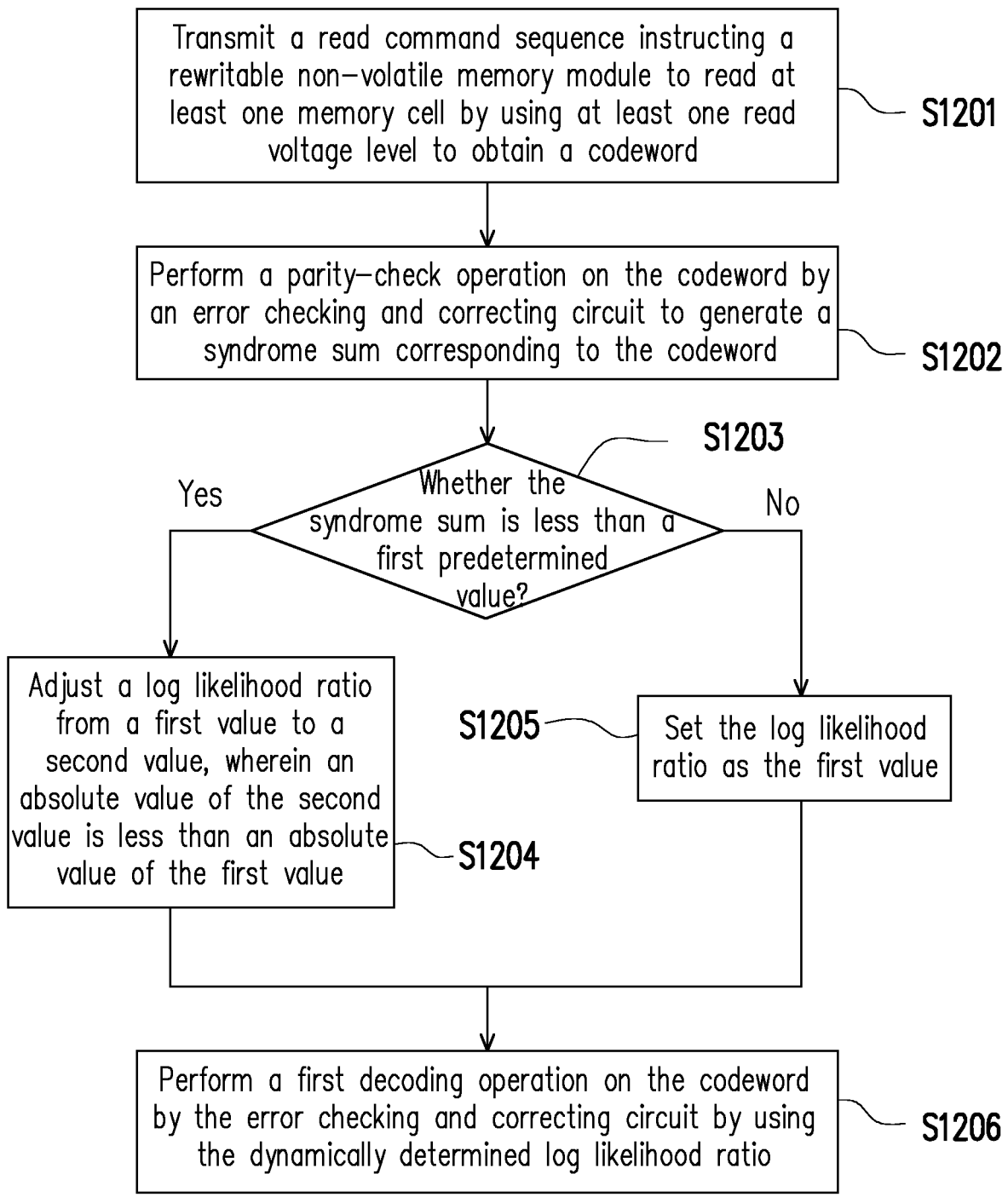
FIG. 12 is a flowchart illustrating a decoding method according to a third exemplary embodiment of the invention.

FIG. 12 is a flowchart illustrating a decoding method according to a third exemplary embodiment of the invention. It should be noted that, in the third exemplary embodiment, the ECCC 508 performs the first decoding operation by using the min-sum algorithm, and the first parameter includes log likelihood ratio (LLR) corresponding to at least part of bits (i.e., the first bit) in the codeword to be decoded.

Referring to FIGS. 9 and 12, at Step S1201, the MMC 502 transmits the read command sequence to the RNVM module 406 to instruct the RNVM module 406 to read at least one memory cell by using at least one RVL to obtain the codeword 901. At Step S1202, the ECCC 508 performs the parity-check operation on the codeword 901 to generate the syndrome sum corresponding to the codeword 901 (e.g., the sum of the syndromes $S_0$ to $S_7$).

At Step S1203, the MMC 502 determines whether the syndrome sum corresponding to the codeword 901 is less than the first predetermined value. If the syndrome sum corresponding to the codeword 901 is less than the first predetermined value, at Step S1204, the MMC 502 adjust the LLR of the first bit from a value (also referred to as a first value) to another value (also referred to as a second value). An absolute value (e.g., 5) of the second value (e.g., −5) is less than an absolute value (e.g., 9) of the first value (e.g., −9). However, if the syndrome sum corresponding to the codeword 901 is not less than the first predetermined value, at Step S1205, the MMC 502 may set the LLR corresponding to the first bit as the first value (e.g., −9). At Step S1206, the ECCC 508 performs the first decoding operation on the codeword 901 by using the dynamically determined LLR.

In other words, in the third exemplary embodiment, if the syndrome sum corresponding to the codeword 901 is less than the first predetermined value, it presents that there is a higher probability that the error floor may occur in the decoding operation for the codeword 901. Therefore, the absolute values of at least some LLRs used in the first decoding operation may be reduced. For example, by reducing the absolute value of the LLR corresponding to the first bit, the probability of flipping of the first bit in the first decoding operation may be increased. Therefore, the probability of occurrence of the error floor is reduced, or the issue of the error floor is dealt with. Comparatively, if the syndrome sum corresponding to the codeword 901 is not less than the first predetermined value, it presents that the probability that the error floor occurs in the decoding operation of the codeword 901 is not high, so the LLR may not be adjusted in response to the error floor.

Fourth Exemplary Embodiment

Figure 13:
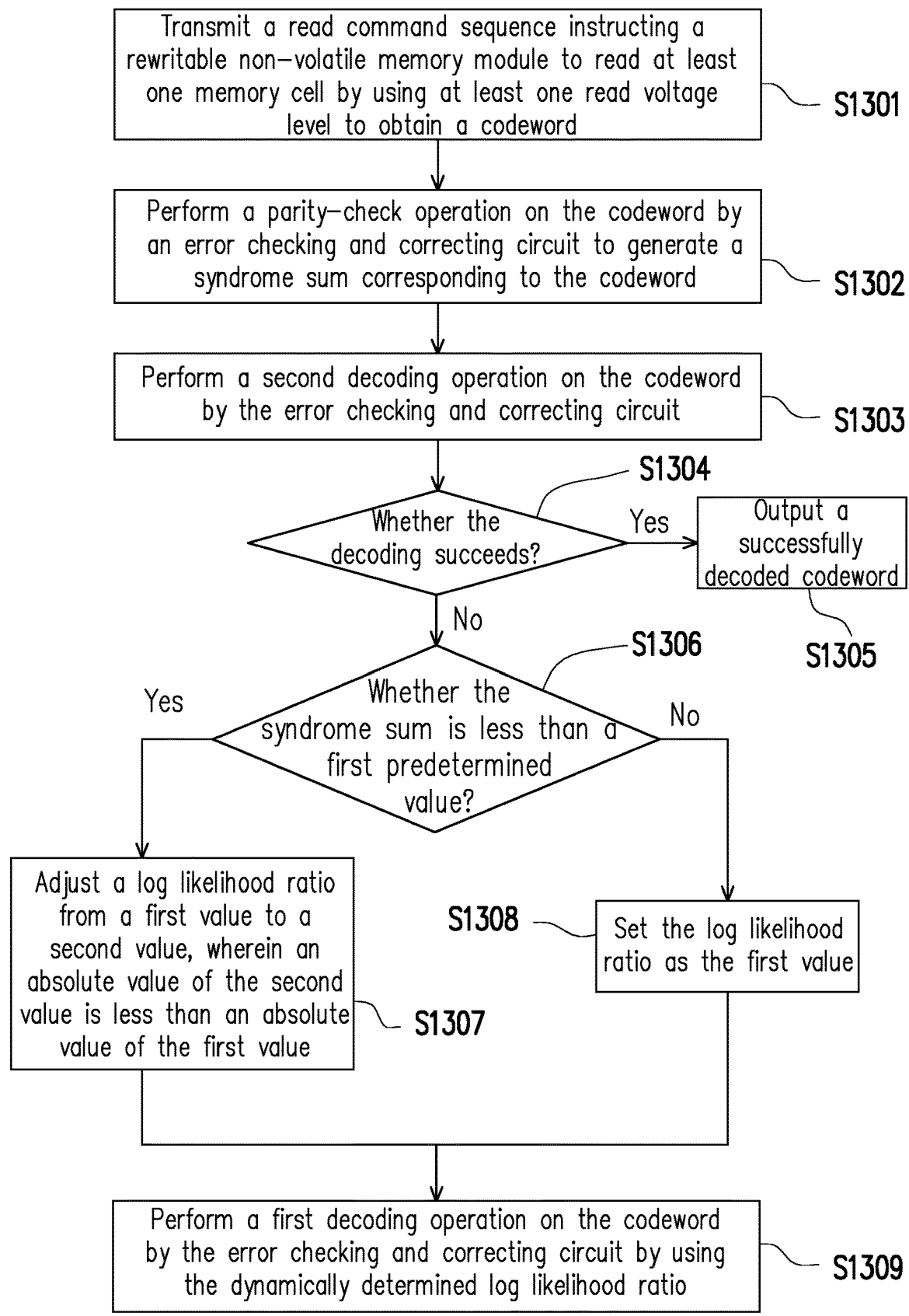
FIG. 13 is a flowchart illustrating a decoding method according to a fourth exemplary embodiment of the invention.

FIG. 13 is a flowchart illustrating a decoding method according to a fourth exemplary embodiment of the invention. It should be noted that, in the fourth exemplary embodiment, after the syndrome sum (also referred to as an initial syndrome sum) corresponding to the codeword to be decoded is preliminarily generated, the ECCC 508 may perform a predetermined decoding operation (also referred to as a second decoding operation). A decoding algorithm used in the second decoding operation may be the same as or different from the decoding algorithm used in the first decoding operation. If the second decoding operation fails (i.e., a valid codeword is not generated in the second decoding operation), the first decoding operation may be performed subsequently. Besides, in the fourth exemplary embodiment, the ECCC 508 performs the first decoding operation by using the min-sum algorithm, and the first parameter includes the LLR corresponding to at least part of bits (i.e., the first bit) in the codeword to be decoded.

Referring to FIGS. 9 and 13, at Step S1301, the MMC 502 transmits the read command sequence to the RNVM module 406 to instruct the RNVM module 406 to read at least one memory cell by using at least one RVL to obtain the codeword 901. At Step S1302, the ECCC 508 performs the parity-check operation on the codeword 901 to generate the initial syndrome sum corresponding to the codeword 901 (e.g., the syndrome sum of the syndromes $S_0$ to $S_7$). At Step S1303, the ECCC 508 performs the second decoding operation on the codeword 901. It should be noted that the second decoding operation at Step S1303 may not include an adjustment of the parameter in response to the issue of the error floor.

At Step S1304, the ECCC 508 determines whether the decoding succeeds. If the decoding succeeds (i.e., the codeword generated through decoding is a valid codeword), at Step S1305, the ECCC 508 outputs the codeword successfully decoded. However, if the decoding does not succeed (i.e., the codeword generated through decoding is not a valid codeword), at Step S1306, the MMC 502 determines whether the initial syndrome sum corresponding to the codeword 901 is less than the first predetermined value.

If the initial syndrome sum corresponding to the codeword 901 is less than the first predetermined value, at Step S1307, the MMC 502 adjusts the LLR corresponding the first bit from the first value to the second value. The absolute value of the second value is less than the absolute value of the first value. However, if the syndrome sum corresponding to the codeword 901 is not less than the first predetermined value, at Step S1308, the MMC 502 may set the LLR corresponding to the first bit as the first value. At Step S1309, the ECCC 508 performs the first decoding operation on the codeword 901 by using the dynamically determined LLR.

It should be noted that, in the fourth exemplary embodiment, the initial syndrome sum used to identify whether the error floor may occur in the decoding operation at Step S1306 is generated by performing the parity-check operation on the codeword that is not decoded yet. In other words, in the fourth exemplary embodiment, the initial syndrome sum may not reflect a state of errors of the codeword being decoded by the second decoding operation, but reflect an original state of errors of the codeword before being decoded by the second decoding operation. For example, the initial syndrome sum may not reflect whether the codeword decoded by the second decoding operation is a valid codeword, but reflect whether the codeword that is not yet decoded by the second decoding operation is a valid codeword (or reflect the original state of errors of original data read from the RNVM module 406). In addition, similar to the first exemplary embodiment, the second decoding operation in the fourth exemplary embodiment may be performed by using various LDPC decoding algorithms, such as the bit flipping algorithm, the min-sum algorithm, or the sum-product algorithm, or other types of decoding algorithms. The invention does not intend to impose a limitation on this regard. Besides, in another exemplary embodiment, the first decoding operation may also use a decoding algorithm of another type. The invention does not intend to impose a limitation on this regard. For example, in another exemplary embodiment, Steps S1307 to S1309 may be replaced by Steps S1104 to S1106 of FIG. 11.

Fifth Exemplary Embodiment

Figure 14:
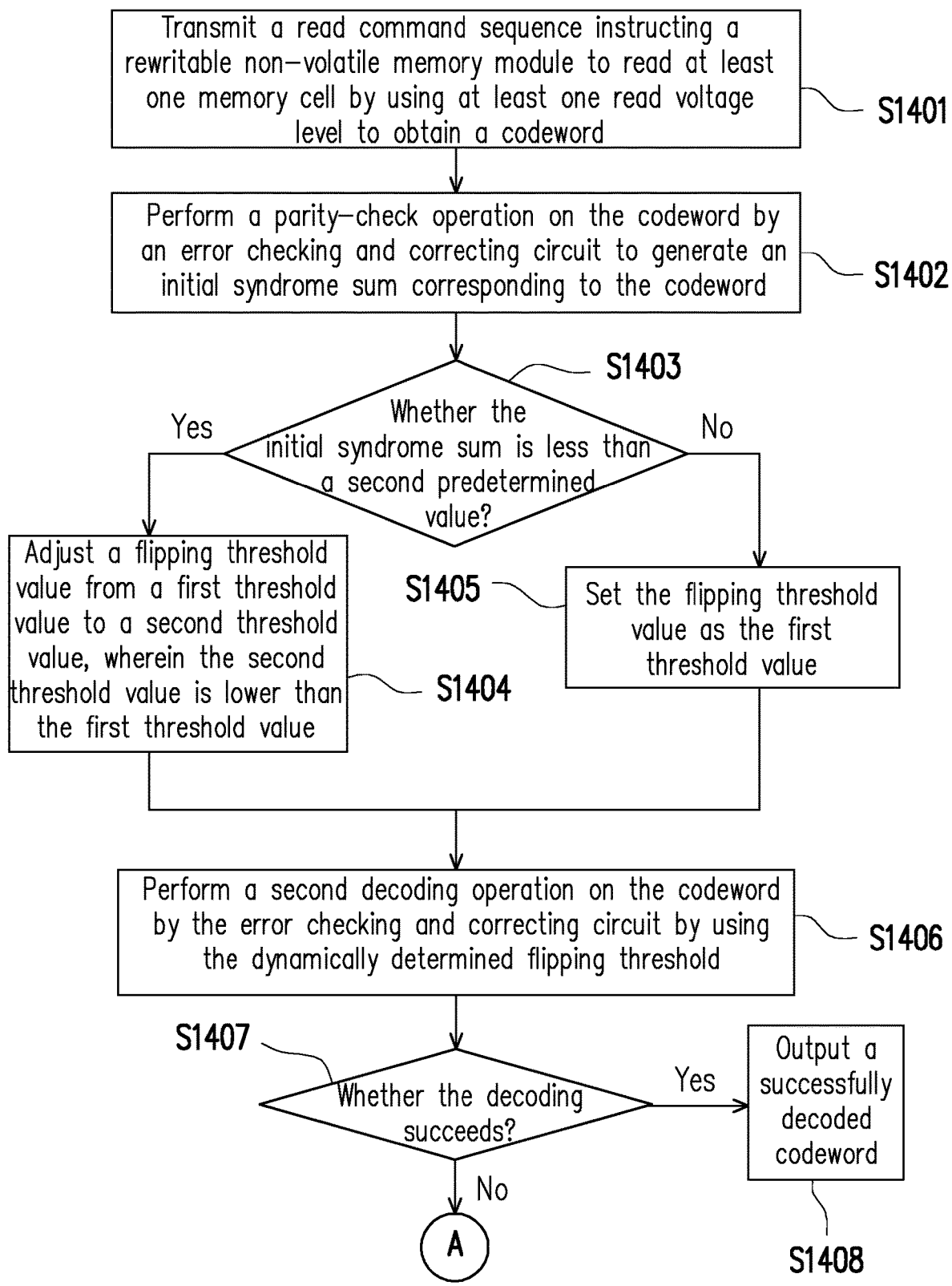
FIGS. 14 and 15 are flowcharts illustrating a decoding method according to a fifth exemplary embodiment of the invention.
Figure 15:
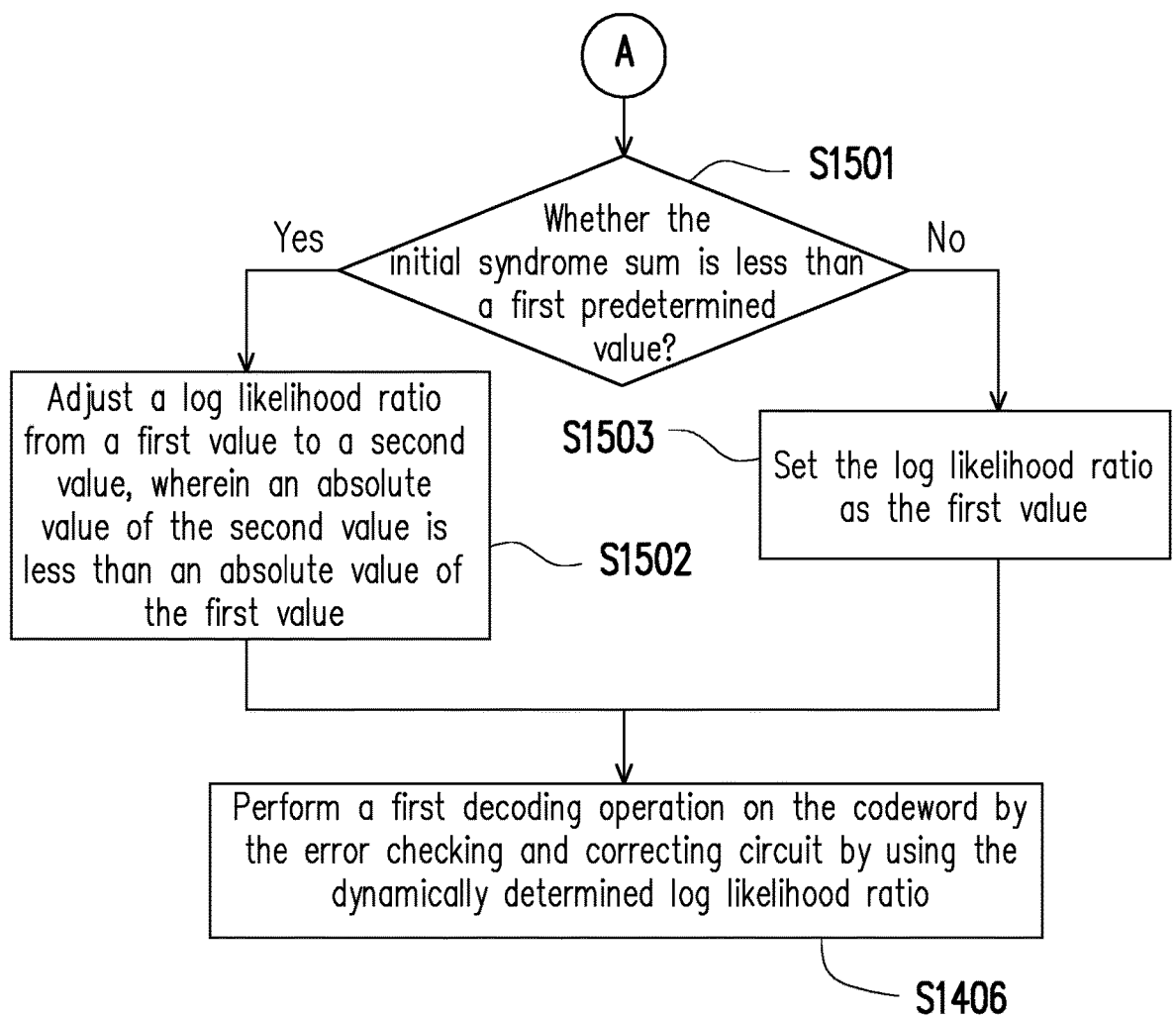

FIGS. 14 and 15 are flowcharts illustrating a decoding method according to a fifth exemplary embodiment of the invention. It should be noted that, in the fifth exemplary embodiment, it is assumed that the bit flipping algorithm is used in the second decoding operation, and the min-sum algorithm is used in the first decoding operation. However, the invention does not intend to impose a limitation on this regard. The first decoding operation and the second decoding operation may be replaced by other decoding algorithms. In addition, a decoding parameter (also referred to as a second parameter) used in the second decoding operation and the first parameter used in the first decoding operation may be dynamically adjusted based on the probability of occurrence of the error floor that is evaluated. Similar to the first parameter, the adjusted second parameter may include various types of parameters that the ECCC 508 may use in the second decoding operation, as long as the adjusted second parameter affects a probability that at least one bits (also referred to as second bit) in the codeword is considered as error bit (or bit to be flipped) in the second decoding operation.

Referring to FIGS. 9 and 14, at Step S1401, the MMC 502 transmits the read command sequence to the RNVM module 406 to instruct the RNVM module 406 to read at least one memory cell by using at least one RVL to obtain the codeword 901. At Step S1402, the ECCC 508 performs the parity-check operation on the codeword 901 to generate the initial syndrome sum corresponding to the codeword 901 (e.g., the syndrome sum of the syndromes $S_0$ to $S_7$).

At Step S1403, the MMC 502 determines whether the initial syndrome sum corresponding to the codeword 901 is less than a predetermined value (also referred to as a second predetermined value). The second predetermined value may be the same as or different from the first predetermined value. For example, the second predetermined value may be 50, greater than 50, or less than 50. If the initial syndrome sum corresponding to the codeword 901 is less than the second predetermined value, at Step S1404, the MMC 502 adjusts the flipping threshold value from the first threshold value to the second threshold value. The second threshold value is less than the first threshold value. However, if the initial syndrome sum corresponding to the codeword 901 is not less than the second predetermined value, at Step S1405, the MMC 502 may set the flipping threshold value as the first threshold value. At Step S1406, the ECCC 508 performs the second decoding operation on the codeword 901 by using the dynamically determined flipping threshold value. Since the second parameter used in the second decoding operation is dynamically adjusted, the probability of occurrence of the error floor in the second decoding operation may be reduced.

At Step S1407, the ECCC 508 determines whether the decoding succeeds. If the decoding succeeds (i.e., the codeword generated through decoding is a valid codeword), at Step S1408, the ECCC 508 outputs the codeword successfully decoded. However, if the decoding does not succeed (i.e., the codeword generated through decoding is not a valid codeword), Step S1501 shown in FIG. 15 is performed.

At Step S1501, the MMC 502 determines whether the initial syndrome sum corresponding to the codeword 901 is less than the first predetermined value. If the initial syndrome sum corresponding to the codeword 901 is less than the first predetermined value, at Step S1502, the MMC 502 adjusts the LLR corresponding the first bit from the first value to the second value. The absolute value of the second value is less than the absolute value of the first value. However, if the syndrome sum corresponding to the codeword 901 is not less than the first predetermined value, at Step S1503, the MMC 502 may set the LLR corresponding to the first bit as the first value. At Step S1504, the ECCC 508 performs the first decoding operation on the codeword 901 by using the dynamically determined LLR.

It should be noted that, in the fifth exemplary embodiment, the initial syndrome sum used to identify whether the error floor may occur in the decoding operation at Steps S1403 and S1501 is generated by performing the parity-check operation on the codeword that is not decoded yet. Details regarding the initial syndrome sum are already described in the foregoing and thus will not be repeated in the following. In the foregoing exemplary embodiments, the first decoding operation and the second decoding operation may be replaced by other types of decoding algorithms, and the parameters adjusted in the decoding operations may also be other types of parameters, as long as the issue that the error floor may occur in the decoding operations is dealt with. Besides, in the foregoing exemplary embodiments, the first decoding operation and the second decoding operation may be performed once or a plurality of times, until a termination condition is reached.

Details about the respective steps in FIGS. 10 to 15 are already described in the foregoing and thus will not be repeated in the following. It should be noted that the respective steps in FIGS. 10 to 15 may be implemented as a plurality of program codes or circuits. The invention does not intend to impose a limitation on this regard. Besides, the methods shown in FIGS. 10 to 15 may be used together with the foregoing embodiments or used individually. The invention does not intend to impose a limitation on this regard.

In view of the foregoing, after the codeword to be decoded is read from the RNVM module, the syndrome sum corresponding to the codeword may be generated by performing the parity check operation. Then, based on whether the syndrome sum is less than the predetermined value, the decoding parameter used by the ECCC in at least one type of the decoding operation may be adjusted dynamically, so as to deal with the issue of the error floor that may occur in the decoding operation. Accordingly the decoding efficiency may be facilitated.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a memory storage device comprising a rewritable non-volatile memory module, wherein the rewritable non-volatile memory module comprises a plurality of memory cells, and the decoding method comprises:
    transmitting a read command sequence, wherein the read command sequence instructs the rewritable non-volatile memory module to read at least one of the memory cells by using at least one read voltage level to obtain a codeword;
    performing a parity check operation on the codeword by an error checking and correcting circuit to generate a syndrome sum corresponding to the codeword; and
    dynamically adjusting a first parameter used by the error checking and correcting circuit in a first decoding operation based on whether the syndrome sum is less than a first predetermined value, and performing the first decoding operation on the codeword by the error checking and correcting circuit by using the first parameter,
    wherein the adjusted first parameter affects a probability that a first bit in the codeword is considered as an error bit in the first decoding operation.

2. The decoding method as claimed in claim 1, wherein the syndrome sum is an initial syndrome sum corresponding to the codeword, and the initial syndrome sum is generated by performing the parity-check operation on the codeword that is not yet decoded.

3. The decoding method as claimed in claim 2, wherein the first decoding operation uses a bit flipping algorithm, and the first parameter comprises a flipping threshold value which is configured to determine a bit to be flipped in the bit flipping algorithm.

4. The decoding method as claimed in claim 3, wherein the step of dynamically adjusting the first parameter used by the error checking and correcting circuit in the first decoding operation based on whether the syndrome sum is less than the first predetermined value comprises:
    adjusting the flipping threshold value from a first threshold value to a second threshold value if the syndrome sum is less than the first predetermined value, wherein the second threshold value is less than the first threshold value; and
    setting the flipping threshold value as the first threshold value if the syndrome sum is not less than the first predetermined value.

5. The decoding method as claimed in claim 2, wherein the first decoding operation uses a min-sum algorithm, and the first parameter comprises a log likelihood ratio corresponding to the first bit.

6. The decoding method as claimed in claim 5, wherein the step of dynamically adjusting the first parameter used by the error checking and correcting circuit in the first decoding operation based on whether the syndrome sum is less than the first predetermined value comprises:
    adjusting the log likelihood ratio from a first value to a second value if the syndrome sum is less than the first predetermined value, wherein an absolute value of the second value is less than an absolute value of the first value; and
    setting the log likelihood ratio as the first value if the syndrome sum is not less than the first predetermined value.

7. The decoding method as claimed in claim 1, wherein the step of dynamically adjusting the first parameter used by the error checking and correcting circuit in the first decoding operation based on whether the syndrome sum is less than the first predetermined value and performing the first decoding operation on the codeword by the error checking and correcting circuit by using the first parameter comprises:
    performing a second decoding operation on the codeword by the error checking and correcting circuit after the syndrome sum is generated; and
    after performing the second decoding operation, dynamically adjusting the first parameter used by the error checking and correcting circuit in the first decoding operation based on whether the syndrome sum is less than the first predetermined value, and performing the first decoding operation on the codeword by the error checking and correcting circuit by using the first parameter,
    wherein different decoding algorithms are used in the first decoding operation and the second decoding operation.

8. The decoding method as claimed in claim 7, wherein the step of performing the second decoding operation on the codeword by the error checking and correcting circuit comprises:
    dynamically adjusting a second parameter used by the error checking and correcting circuit in the second decoding operation based on whether the syndrome sum is less than a second predetermined value, and performing the second decoding operation on the codeword by the error checking and correcting circuit by using the second parameter,
    wherein the adjusted second parameter affects a probability that a second bit in the codeword is considered as the error bit in the second decoding operation.

9. A memory storage device, comprising:
    a connection interface unit, coupled to a host system;
    a rewritable non-volatile memory module, comprising a plurality of memory cells; and
    a memory control circuit unit, coupled to the connection interface unit and the rewritable non-volatile memory module,
    wherein the memory control circuit unit is configured to transmit a read command sequence instructing the rewritable non-volatile memory module to read at least one of the memory cells by using at least one read voltage level to obtain a codeword, wherein the memory control circuit unit is further configured to perform a parity check operation on the codeword to generate a syndrome sum corresponding to the codeword, wherein the memory control circuit unit is further configured to dynamically adjust a first parameter used in a first decoding operation based on whether the syndrome sum is less than a first predetermined value and perform the first decoding operation on the codeword by using the first parameter, wherein the adjusted first parameter affects a probability that a first bit in the codeword is considered as an error bit in the first decoding operation.

10. The memory storage device as claimed in claim 9, wherein the syndrome sum is an initial syndrome sum corresponding to the codeword, and the initial syndrome sum is generated by performing the parity-check operation on the codeword that is not yet decoded.

11. The memory storage device as claimed in claim 10, wherein the first decoding operation uses a bit flipping algorithm, and the first parameter comprises a flipping threshold value which is configured to determine a bit to be flipped in the bit flipping algorithm.

12. The memory storage device as claimed in claim 11, wherein the operation of dynamically adjusting the first parameter used in the first decoding operation based on whether the syndrome sum is less than the first predetermined value by the memory control circuit unit comprises:

adjusting the flipping threshold value from a first threshold value to a second threshold value if the syndrome sum is less than the first predetermined value, wherein the second threshold value is less than the first threshold value; and setting the flipping threshold value as the first threshold value if the syndrome sum is not less than the first predetermined value.

13. The memory storage device as claimed in claim 10, wherein the first decoding operation uses a min-sum algorithm, and the first parameter comprises a log likelihood ratio corresponding to the first bit.

14. The memory storage device as claimed in claim 13, wherein the operation of dynamically adjusting the first parameter used in the first decoding operation based on whether the syndrome sum is less than the first predetermined value by the memory control circuit unit comprises:

adjusting the log likelihood ratio from a first value to a second value if the syndrome sum is less than the first predetermined value, wherein an absolute value of the second value is less than an absolute value of the first value; and setting the log likelihood ratio as the first value if the syndrome sum is not less than the first predetermined value.

15. The memory storage device as claimed in claim 9, wherein the operation of dynamically adjusting the first parameter used in the first decoding operation based on whether the syndrome sum is less than the first predetermined value and performing the first decoding operation on the codeword by using the first parameter by the memory control circuit unit comprises:

performing a second decoding operation on the codeword after the syndrome sum is obtained; and after performing the second decoding operation, dynamically adjusting the first parameter used in the first decoding operation based on whether the syndrome sum is less than the first predetermined value, and performing the first decoding operation on the codeword by using the first parameter, wherein different decoding algorithms are used in the first decoding operation and the second decoding operation.

16. The memory storage device as claimed in claim 15, wherein the operation of performing the second decoding operation on the codeword by the memory control circuit unit comprises:

dynamically adjusting a second parameter used in the second decoding operation based on whether the syndrome sum is less than a second predetermined value, and performing the second decoding operation on the codeword by using the second parameter, wherein the adjusted second parameter affects a probability that a second bit in the codeword is considered as the error bit in the second decoding operation.

17. A memory control circuit unit, for controlling a memory storage device, wherein the memory storage device comprises a rewritable non-volatile memory module, the rewritable non-volatile memory module comprises a plurality of memory cells, and the memory control circuit unit comprises:

a host interface, coupled to a host system;

a memory interface, coupled to the rewritable non-volatile memory module;

an error checking and correcting circuit; and a memory management circuit, coupled to the host interface, the memory interface, and the error checking and correcting circuit, wherein the memory management circuit is configured to transmit a read command sequence instructing the rewritable non-volatile memory module to read at least one of the memory cells by using at least one read voltage level to obtain a codeword, wherein the error checking and correcting circuit is configured to perform a parity check operation on the codeword to generate a syndrome sum corresponding to the codeword, wherein the error checking and correcting circuit is further configured to dynamically adjust a first parameter used in a first decoding operation based on whether the syndrome sum is less than a first predetermined value, and perform the first decoding operation on the codeword by using the first parameter, wherein the adjusted first parameter affects a probability that a first bit in the codeword is considered as an error bit in the first decoding operation.

18. The memory control circuit unit as claimed in claim 17, wherein the syndrome sum is an initial syndrome sum corresponding to the codeword, and the initial syndrome sum is generated by performing the parity-check operation on the codeword that is not yet decoded.

19. The memory control circuit unit as claimed in claim 18, wherein the first decoding operation uses a bit flipping algorithm, and the first parameter comprises a flipping threshold value which is configured to determine a bit to be flipped in the bit flipping algorithm.

20. The memory control circuit unit as claimed in claim 19, wherein the operation of dynamically adjusting the first parameter used in the first decoding operation based on whether the syndrome sum is less than the first predetermined value by the error checking and correcting circuit comprises:

adjusting the flipping threshold value from a first threshold value to a second threshold value if the syndrome sum is less than the first predetermined value, wherein the second threshold value is less than the first threshold value; and setting the flipping threshold value as the first threshold value if the syndrome sum is not less than the first predetermined value.

21. The memory control circuit unit as claimed in claim 18, wherein the first decoding operation uses a min-sum algorithm, and the first parameter comprises a log likelihood ratio corresponding to the first bit.

22. The memory control circuit unit as claimed in claim 21, wherein the operation of dynamically adjusting the first parameter used in the first decoding operation based on whether the syndrome sum is less than the first predetermined value by the error checking and correcting circuit comprises:

adjusting the log likelihood ratio from a first value to a second value if the syndrome sum is less than the first predetermined value, wherein an absolute value of the second value is less than an absolute value of the first value; and setting the log likelihood ratio as the first value if the syndrome sum is not less than the first predetermined value.

23. The memory control circuit unit as claimed in claim 17, wherein the operation of dynamically adjusting the first parameter used in the first decoding operation based on whether the syndrome sum is less than the first predetermined value and performing the first decoding operation on the codeword by using the first parameter by the error checking and correcting circuit comprises:

performing a second decoding operation on the codeword by the error checking and correcting circuit after the syndrome sum is obtained; and after performing the second decoding operation, dynamically adjusting the first parameter used in the first decoding operation based on whether the syndrome sum is less than the first predetermined value and performing the first decoding operation on the codeword by using the first parameter by the error checking and correcting circuit, wherein different decoding algorithms are used in the first decoding operation and the second decoding operation.

24. The memory control circuit unit as claimed in claim 23, wherein the operation of performing the second decoding operation on the codeword by the error checking and correcting circuit comprises:

dynamically adjusting a second parameter used in the second decoding operation based on whether the syndrome sum is less than a second predetermined value and performing the second decoding operation on the codeword by using the second parameter by the error checking and correcting circuit, wherein the adjusted second parameter affects a probability that a second bit in the codeword is considered as the error bit in the second decoding operation.

* * * * *